(12) United States Patent
Kwon et al.

(10) Patent No.: US 9,209,214 B2
(45) Date of Patent: Dec. 8, 2015

(54) SEMICONDUCTOR DEVICE AND METHOD OF FABRICATING THE SAME

(71) Applicant: Samsung Electronics Co., Ltd., Gyeonggi-do (KR)

(72) Inventors: Doo-Won Kwon, Seongnam-si (KR); June-Mo Koo, Seoul (KR); Yun-Ki Lee, Seoul (KR); Se-Hoon Jang, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/893,592

(22) Filed: May 14, 2013

(65) Prior Publication Data

US 2013/0307110 A1 Nov. 21, 2013

(30) Foreign Application Priority Data

May 15, 2012 (KR) .................. 10-2012-0051603

(51) Int. Cl.
*H01L 27/146* (2006.01)
*H01L 27/144* (2006.01)

(52) U.S. Cl.
CPC ........ *H01L 27/1463* (2013.01); *H01L 27/1464* (2013.01); *H01L 27/14687* (2013.01); *H01L 27/144* (2013.01); *H01L 27/146* (2013.01); *H01L 27/14601* (2013.01); *H01L 27/14607* (2013.01); *H01L 27/14643* (2013.01); *H01L 27/14683* (2013.01); *H01L 27/14689* (2013.01)

(58) Field of Classification Search
CPC ..................................... H01L 27/146
USPC ................................. 257/222, 446
See application file for complete search history.

(56) References Cited

U.S. PATENT DOCUMENTS

| 5,581,099 | A | 12/1996 | Kusaka et al. | |
| 6,927,091 | B2 | 8/2005 | Harada | |
| 2007/0075338 | A1* | 4/2007 | Park et al. | 257/222 |
| 2008/0217719 | A1* | 9/2008 | Liu et al. | 257/446 |
| 2010/0140675 | A1 | 6/2010 | Rhodes | |
| 2010/0271524 | A1* | 10/2010 | Venezia et al. | 348/308 |

FOREIGN PATENT DOCUMENTS

| JP | 2000-294760 | 10/2000 |
| JP | 2003-060192 | 2/2003 |
| JP | 2004-047985 | 2/2004 |
| KR | 10-2005-0090912 A | 9/2005 |
| KR | 10-2006-0020387 A | 3/2006 |

* cited by examiner

*Primary Examiner* — Victor A. Mandala
*Assistant Examiner* — William Harriston
(74) *Attorney, Agent, or Firm* — Lee & Morse P.C.

(57) ABSTRACT

A semiconductor device includes a substrate including a front side and a back side opposite the front side, first P-type regions located adjacent to the back side and spaced apart from each other in the substrate, N-type regions located under the first P-type regions and spaced apart from each other in the substrate, and second P-type regions located adjacent to the back side and located between the first P-type regions.

19 Claims, 27 Drawing Sheets

SEMICONDUCTOR DEVICE AND METHOD OF FABRICATING THE SAME

CROSS-REFERENCE TO RELATED APPLICATION

The present application claims priority under 35 U.S.C. §119 to Korean Patent Application No. 10-2012-0051603, filed on May 15, 2012, in the Korean Intellectual Property Office, and entitled: "Semiconductor Device and Method of Fabricating the Same," which is incorporated by reference herein in its entirety.

BACKGROUND

1. Field

Example embodiments relate to a semiconductor device having a backside illumination CMOS image sensor and a method of fabricating the same.

2. Description of Related Art

Techniques are being actively studied for improving the quantum efficiency of light in a semiconductor device having a backside illumination CMOS image sensor.

SUMMARY

Embodiments are directed to a semiconductor device including a substrate including a front side and a back side opposite the front side, first P-type regions located adjacent to the back side and spaced apart from each other in the substrate, N-type regions located under the first P-type regions and spaced apart from each other in the substrate, and second P-type regions located adjacent to the back side and located between the first P-type regions.

The second P-type regions may have a greater vertical thickness than the first P-type regions and may have a lesser vertical thickness than the N-type regions.

The second P-type regions may be narrower in maximum horizontal width than the first P-type regions and may be narrower in maximum horizontal width than the N-type regions.

The second P-type regions may be horizontally spaced apart from the N-type regions.

Left-side surfaces of the second P-type regions may be in contact with right-side surfaces of the first P-type regions, and right-side surfaces of the second P-type regions are in contact with left-side surfaces of the first P-type regions.

The first P-type regions and the second P-type regions may include boron.

The semiconductor device may further include frontal P-type regions in contact with a lower surface of the N-type regions and the front side of the substrate.

The second P-type regions may have a higher impurity concentration than the first P-type regions.

The second P-type regions may include impurities selected from silicon (Si), carbon (C), germanium (Ge), tin (Sn), neon (Ne), argon (Ar), krypton (Kr), and xenon (Xe).

The semiconductor device may further including third P-type regions located adjacent to the back side and located between the N-type regions.

The third P-type regions may have a greater vertical thickness than the second P-type regions and may have a lesser vertical thickness than the N-type regions.

The third P-type regions may be narrower in maximum horizontal width than the second P-type regions.

The third P-type regions may include boron.

The third P-type regions may have a higher impurity concentration than the second P-type regions.

Embodiments are also directed to a semiconductor device, including a substrate including a front side and a back side, insulating patterns in contact with the front side of the substrate and formed in the substrate, first P-type regions located adjacent to the back side in the substrate and formed in the substrate, and second P-type regions located between the first P-type regions in the substrate, and vertically aligned and in an overlapping relationship with the insulating patterns.

Embodiments are also directed to a semiconductor device including a substrate including a front side and a back side opposite the front side, first P-type regions located adjacent to the back side and spaced apart from each other in the substrate, first separation regions located adjacent to the back side between the first P-type regions, N-type regions located under the first P-type regions and spaced apart from each other in the substrate, frontal P-type regions located adjacent to the front side and in contact with a lower surface of the N-type regions, and frontal separation regions located adjacent to the front side between the frontal P-type regions. The first separation regions have a greater vertical thickness than the first P-type regions. The first separations regions have a lesser vertical thickness than the N-type regions. The first separation regions are spaced apart from the N-type regions. The frontal separation regions have a greater vertical thickness than the frontal P-type regions. The frontal separations regions have a lesser vertical thickness than the N-type regions. The frontal separation regions are spaced apart from the N-type regions.

The first separation regions may include second P-type regions having a greater impurity concentration than the first P-type regions.

Each of the first separation regions may include a pair of second P-type regions and a third P-type region between the second P-type regions, the third P-type region having a greater vertical thickness and a higher impurity concentration than the pair of second P-type regions.

The frontal separation regions may be one selected from insulating patterns, amorphous impurity separation regions, fourth P-type separation regions, and separation regions including a pair of the fourth P-type separation regions and a fifth P-type separation region.

BRIEF DESCRIPTION OF THE DRAWINGS

Features will become apparent to those of skill in the art by describing in detail exemplary embodiments with reference to the attached drawings in which.

DETAILED DESCRIPTION

Figure 1A:
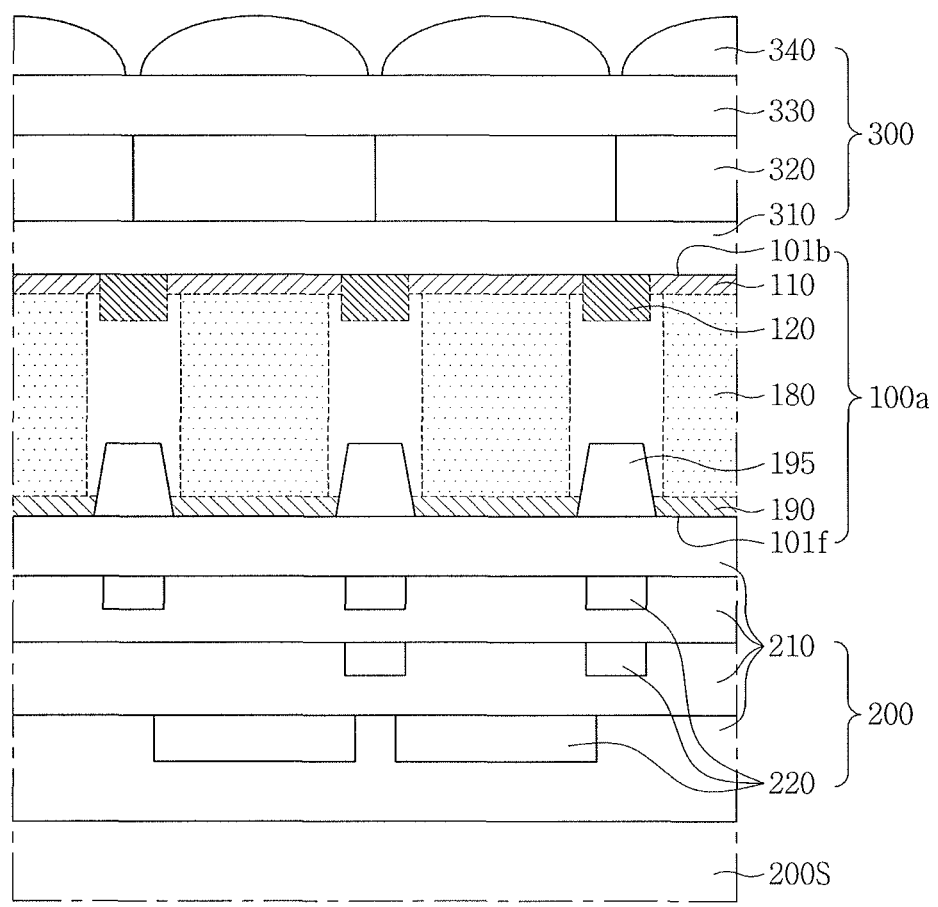
FIG. 1A illustrates a longitudinal section schematically showing a semiconductor device according to an exemplary embodiment.

Exemplary embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of exemplary embodiments. As used herein, the term "and/or" includes any and all combinations of one or more of the associated listed items.

It will be understood that, if an element is referred to as being "connected" or "coupled" with another element, it can be directly connected, or coupled, to the other element or intervening elements may be present. In contrast, if an element is referred to as being "directly connected" or "directly coupled" with another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper," "left-side," "right-side," and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Exemplary embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, exemplary embodiments should not be construed as limited to the particular shape illustrated herein but may include deviations in shapes that result, for example, from manufacturing. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Herein, terms such as "back side" and "front side" are used as generally understood in the field of CMOS image sensors. Specifically, the term "front side" of a semiconductor substrate refers to a side closest to an interconnection portion including electrical connections. The opposite side of the semiconductor substrate is referred to as the "back side." In a backside illumination CMOS sensor, the back side of the semiconductor device is a light receiving side of the semiconductor substrate. In the figures, the back side is depicted towards the top of the figure, except in drawings showing early stages in the fabrication of the semiconductor device before the semiconductor substrate is flipped over. Terms such as "vertical" refer to a direction between the back side and the front side, and terms such as "horizontal refer to directions parallel to the back side and the front side.

FIG. 1A illustrates a longitudinal section schematically showing a semiconductor device according to an exemplary embodiment.

Referring to FIG. 1A, a semiconductor device 10A according to the exemplary embodiment may include a semiconductor substrate 100a, an interconnection portion 200 under the semiconductor substrate 100a, a supporting substrate 200S, and a light-receiving portion 300 on the semiconductor substrate 100a.

The semiconductor substrate 100a may include regions including N-type and/or P-type impurities, and insulating patterns 195. For example, the semiconductor substrate 100a may have a back side 101b as an upper surface, and a front side 101f as a lower surface. The semiconductor substrate 100a may include first P-type regions 110 and second P-type regions 120 formed in the semiconductor substrate 100a adjacent to or abutting the back side 101b. The semiconductor substrate 100a may include frontal P-type regions 190 and the insulating patterns 195 formed in the semiconductor substrate 100a adjacent to or abutting the front side 101f. The semiconductor substrate 100a may include a plurality of N-type regions 180 formed in the semiconductor substrate 100a in contact with a lower portion of the first P-type regions 110 and an upper portion of the frontal P-type regions 190. The first P-type regions 110 may be formed to extend from the back side 101b to an inside of the semiconductor substrate 100a. The first P-type regions 110 may include boron (B) therein.

The first P-type regions 110 may be higher in impurity concentration than the semiconductor substrate 100a. The first P-type regions 110 and the N-type regions 180 may form PN diodes. The second P-type regions 120 may be formed between the first P-type regions 110. An upper portion of the second P-type regions 120 may be in contact with the back side 101b. A portion of each of left-side surfaces of the second P-type regions 120 may be in contact with a corresponding adjacent right-side surface of the first P-type regions 110.

A portion of each of right-side surfaces of the second P-type regions 120 may be in contact with a corresponding adjacent left-side surface of the first P-type regions 110. The second P-type regions 120 may be horizontally spaced apart from the N-type regions 180. The second P-type regions 120 may have a greater vertical thickness than the first P-type regions 110, and may have a lesser vertical thickness than the N-type regions 180. The second P-type regions 120 may be narrower in maximum horizontal width than the first P-type regions 110 and the N-type regions 180.

An uppermost level of the second P-type regions 120 may be higher than an uppermost level of the N-type regions 180. The second P-type regions 120 may be in a vertically overlapping and aligned relationship with the insulating patterns 195. The second P-type regions 120 may include boron (B) therein. The second P-type regions 120 may be higher in impurity concentration than the first P-type regions 110. The second P-type regions 120 may reduce movement of electrons between neighboring N-type regions 180.

The second P-type regions 120 may reduce the movement of electrons to reduce crosstalk between the N-type regions 180. The second P-type regions 120 may reduce crosstalk to increase quantum efficiency due to light in each of the N-type regions 180. Upper portions of the frontal P-type regions 190 may be in contact with lower portions of the N-type regions 180, and lower portions of the frontal P-type regions 190 may be formed adjacent to or abutting the front side 101f.

The frontal P-type regions 190 may be in contact with the N-type regions 180 to form PN diodes. The insulating patterns 195 may be in contact with the front side 101f, and may be formed between the N-type regions 180. The insulating patterns 195 may include silicon oxide. The insulating patterns 195 may be one of a device isolating pattern, an STI (shallow trench isolation), and a field region.

The interconnection portion 200 may be formed under the semiconductor substrate 100a, and may include interlayer insulating layers 210 and conductive patterns 220. The supporting substrate 200S may be formed under the interconnection portion 200. The light-receiving portion 300 may include a passivation layer 310 in contact with the semiconductor substrate 100a and formed on the semiconductor substrate 100a, color filters 320 formed on the passivation layer 310, a planarization layer 330 formed on the color filters 320, and micro lenses 340 formed on the planarization layer 330.

Figure 1B:
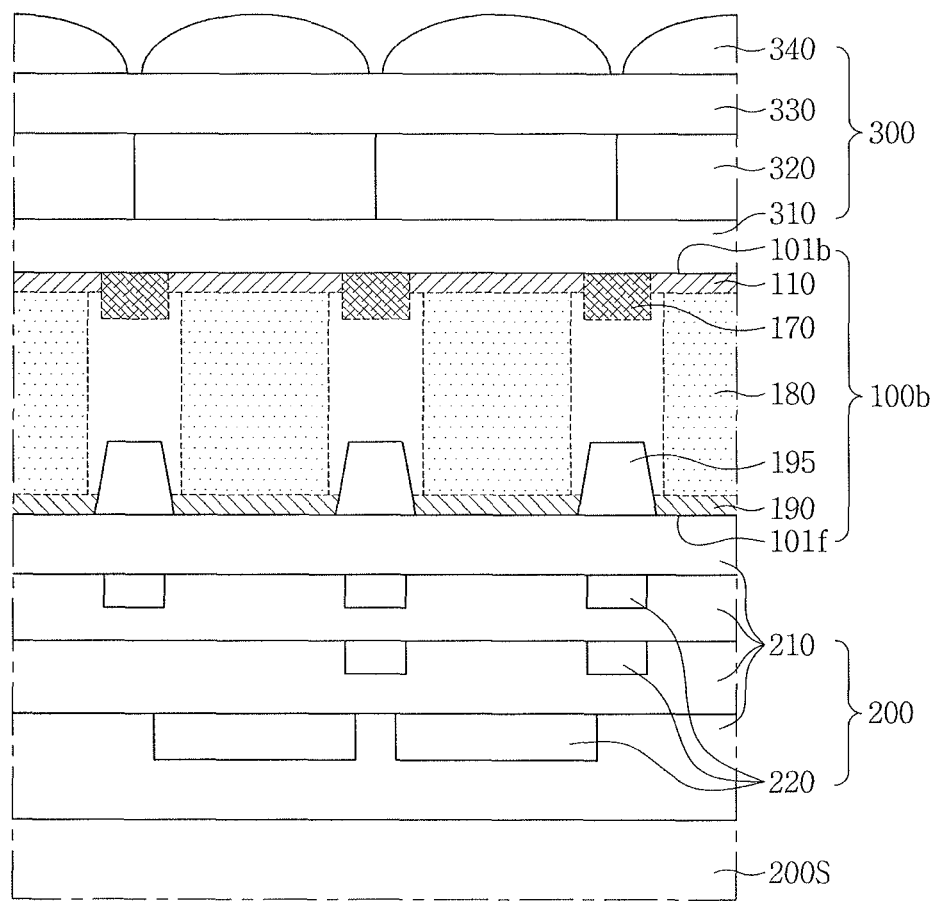
FIGS. 1B to 1H illustrate longitudinal sections schematically showing semiconductor devices according to various other exemplary embodiments.

FIG. 1B illustrates a longitudinal section schematically showing a semiconductor device according to another exemplary embodiment.

Referring to FIG. 1B, a semiconductor device 10B according to this embodiment may include a semiconductor substrate 100b, an interconnection portion 200 under the semiconductor substrate 100b, a supporting substrate 200S under the interconnection portion 200, and a light-receiving portion 300 on the semiconductor substrate 100b. The semiconductor device 10B may further include amorphous impurity regions 170 formed between first P-type regions 110, adjacent to or abutting a back side 101b.

A portion of each of left-side surfaces of the amorphous impurity regions 170 may be in contact with a corresponding adjacent right-side surface of the first P-type regions 110. A portion of each of right-side surfaces of the amorphous impurity regions 170 may be in contact with a corresponding adjacent left-side surface of the first P-type regions 110. The amorphous impurity regions 170 may be horizontally spaced from the N-type regions 180.

The amorphous impurity regions 170 may have a greater vertical thickness than the first P-type regions 110, and may have a lesser vertical thickness than the N-type regions 180. The amorphous impurity regions 170 may be narrower in maximum horizontal width than the first P-type regions 110 and the N-type regions 180. An uppermost level of the amorphous impurity regions 170 may be higher than an uppermost level of the N-type regions 180.

The center of the amorphous impurity regions 170 may be in a vertically overlapping and aligned relationship with the center of the insulating pattern 195. The amorphous impurity regions 170 may include boron, and an impurity selected from silicon (Si), carbon (C), germanium (Ge), tin (Sn), neon (Ne), argon (Ar), krypton (Kr), and xenon (Xe). The concentration of boron in the amorphous impurity regions 170 may be the same as that in the first P-type regions 110.

The amorphous impurity regions 170 may reduce crosstalk between neighboring N-type regions 180 to improve quantum efficiency due to light in each of the N-type regions 180.

Figure 1C:
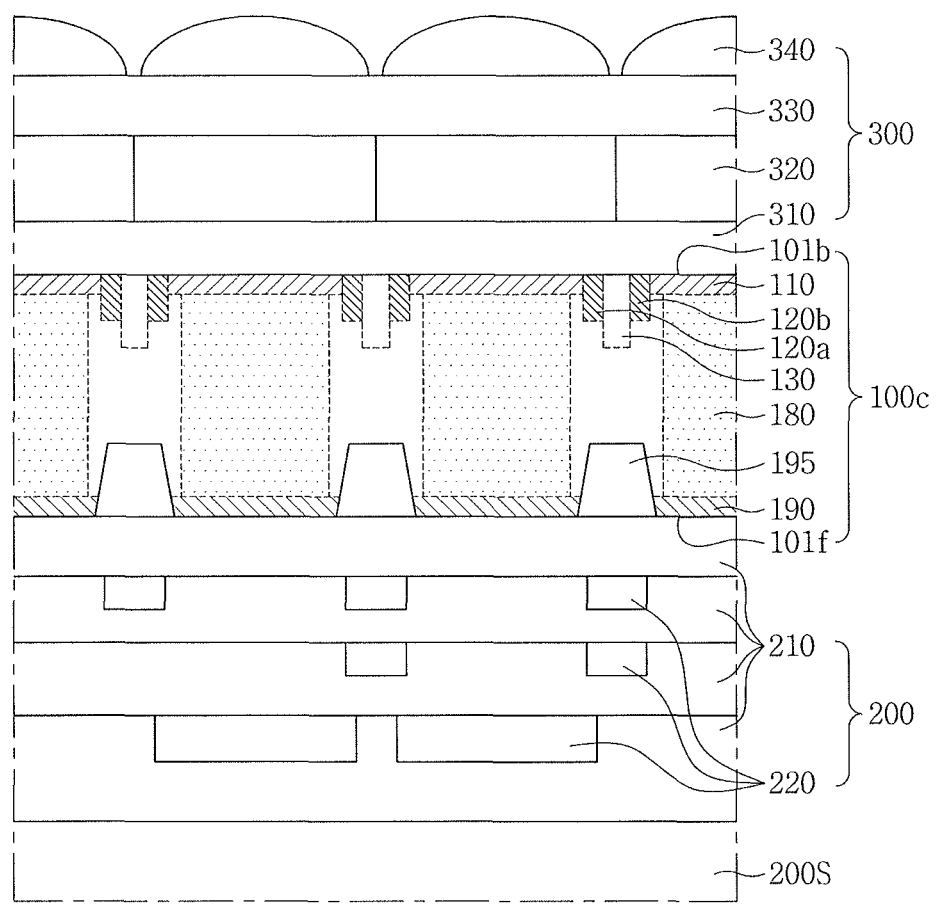

FIG. 1C illustrates a longitudinal section schematically showing a semiconductor device according to another exemplary embodiment.

Referring to FIG. 1C, a semiconductor device 10C according to this exemplary embodiments may include a semiconductor substrate 100c, an interconnection portion 200 under the semiconductor substrate 100c, a supporting substrate 200S under the interconnection portion 200, and a light-receiving portion 300 on the semiconductor substrate 100c.

The semiconductor device 10C may further include first P-type regions 110 formed in the substrate 100c, second separation regions 120a and 120b formed between the first P-type regions 110, and third P-type regions 130 formed between the second separation regions 120a and 120b. The third P-type regions 130 may be formed adjacent to or abutting a back side 101b of the semiconductor substrate 100c.

A portion of each of left-side surfaces of the third P-type regions 130 may be in contact with a corresponding adjacent right-side surface of the second separation regions 120a. A portion of each of right-side surfaces of the third P-type regions 130 may be in contact with a corresponding adjacent left-side surface of the second separation regions 120b. The third P-type regions 130 may be horizontally spaced from the N-type regions 180.

The third P-type regions 130 may have a greater vertical thickness than the second separation regions 120a and 120b, and may have a lesser vertical thickness than the N-type regions 180. The third P-type regions 130 may be narrower in maximum horizontal width than the N-type regions 180. An uppermost level of the third P-type regions 130 may be higher than an uppermost level of the N-type regions 180.

The third P-type regions 130 may be in a vertically overlapping and aligned relationship with the insulating patterns 195. The first P-type regions 110, the second separation regions 120a and 120b, and the third P-type regions 130 may include boron. The third P-type regions 130 may be higher in boron concentration than the second separation regions 120a and 120b. The second separation regions 120a and 120b may be higher in boron concentration than the first P-type regions 110.

The second separation regions 120a and 120b, and the third P-type regions 130 may reduce crosstalk between neighboring N-type region 180 to improve quantum efficiency due to light in each of the N-type regions 180.

Figure 1D:
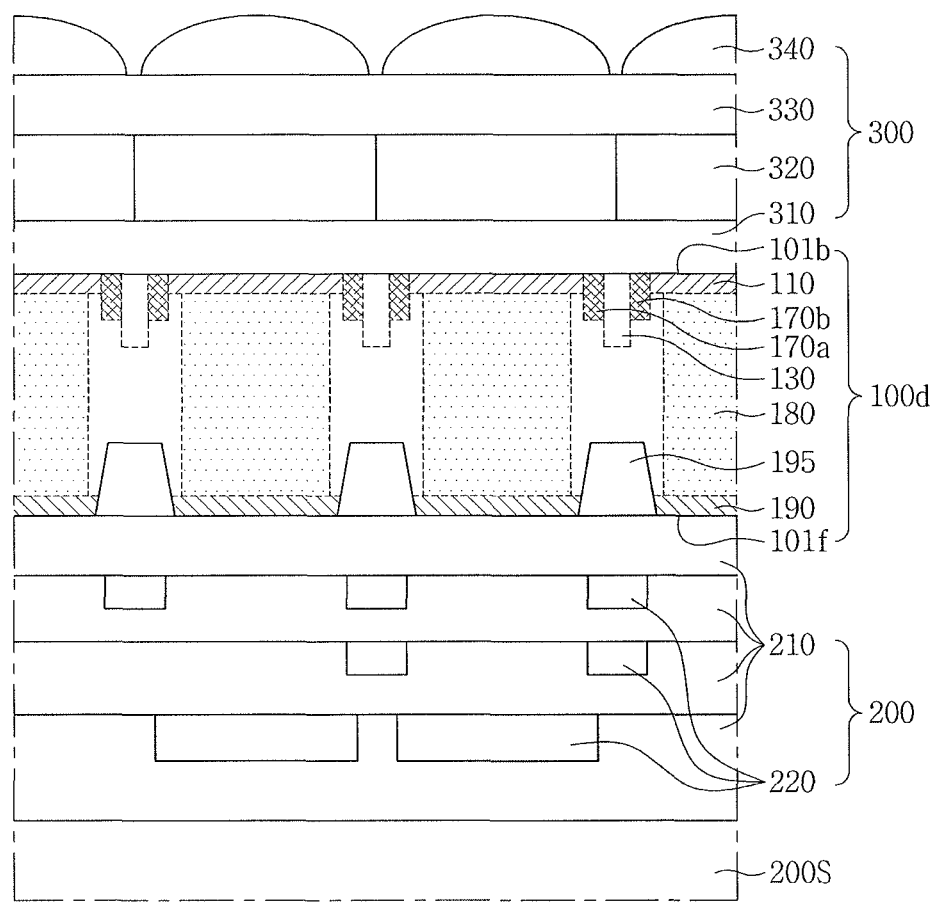

FIG. 1D illustrates a longitudinal section schematically showing a semiconductor device according to another exemplary embodiment.

Referring to FIG. 1D, a semiconductor device 10D according to this exemplary embodiment may include a semiconductor substrate 100d, an interconnection portion 200 under the semiconductor substrate 100d, a supporting substrate 200S under the interconnection portion 200, and a light-receiving portion 300 on the semiconductor substrate 100d.

The semiconductor device 10D may further include first P-type regions 110 formed in the semiconductor substrate 100d, amorphous impurity separation regions 170a and 170b formed between the first P-type regions 110, and third P-type regions 130 formed between the amorphous impurity separation regions 170a and 170b. The third P-type regions 130 may be formed adjacent to or abutting a back side 101b of the semiconductor substrate 10d.

A portion of each of left-side surfaces of the third P-type regions 130 may be in contact with a corresponding adjacent right-side surface of the amorphous impurity separation regions 170a. A portion of each of right-side surfaces of the third P-type regions 130 may be in contact with a corresponding adjacent left-side surface of the amorphous impurity separation regions 170b. The third P-type regions 130 may be horizontally spaced from the N-type regions 180.

The third P-type regions 130 may have a greater vertical thickness than the amorphous impurity separation regions 170a and 170b, and may have a lesser vertical thickness than the N-type regions 180. The third P-type regions 130 may be narrower in maximum horizontal width than the N-type regions 180. An uppermost level of the third P-type regions 130 may be higher than an uppermost level of the N-type regions 180. The center of the third P-type regions 130 may be in a vertically overlapping and aligned relationship with the center of the insulating patterns 195.

The first P-type regions 110, the amorphous impurity separation regions 170a and 170b, and the third P-type regions 130 may include boron. The concentration of boron in the third P-type regions 130 may be higher than that in the amorphous impurity separation regions 170a and 170b. The concentration of boron in the amorphous impurity separation regions 170a and 170b may be the same as that in the first P-type regions 110. The amorphous impurity separation regions 170a and 170b may include an impurity selected from silicon (Si), carbon (C), germanium (Ge), tin (Sn), neon (Ne), argon (Ar), krypton (Kr), and xenon (Xe).

Figure 1E:
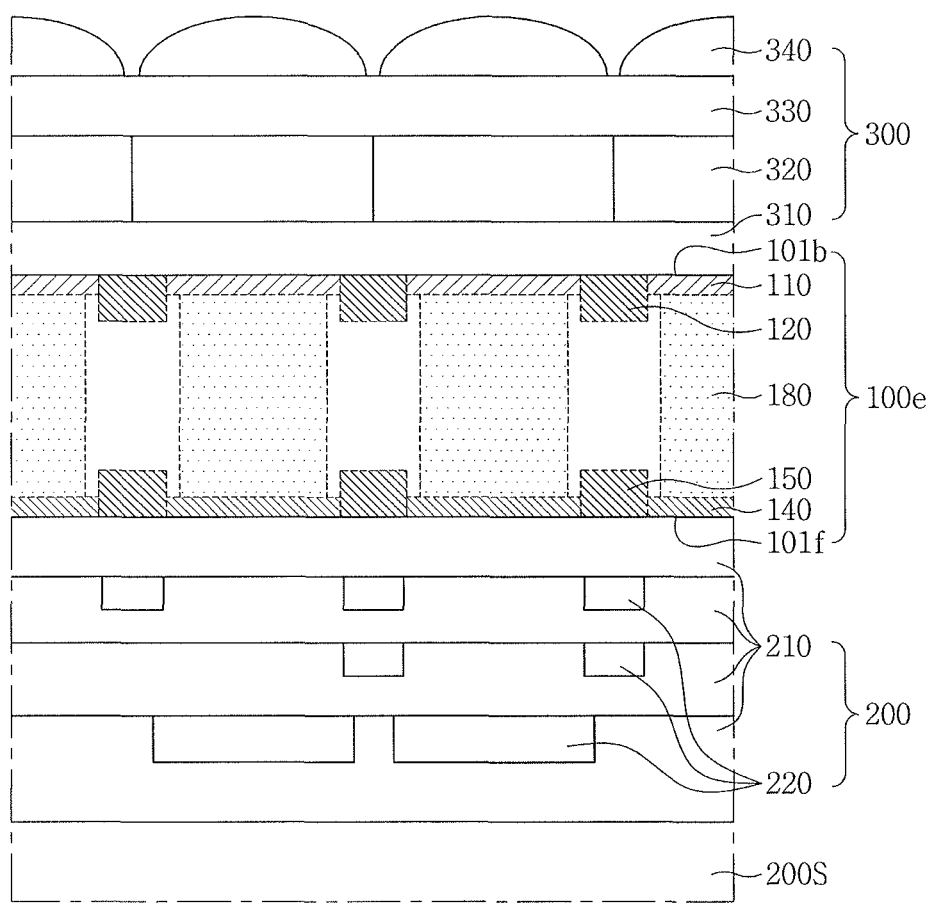

FIG. 1E illustrates a longitudinal section schematically showing a semiconductor device according to another exemplary embodiment.

Referring to FIG. 1E, a semiconductor device 10E according to this exemplary embodiment may include a semiconductor substrate 100e, an interconnection portion 200 under the semiconductor substrate 100e, a supporting substrate 200S under the interconnection portion 200, and a light-receiving portion 300 on the semiconductor substrate 100e.

The semiconductor device 10E may include first P-type regions 110 and second P-type regions 120 formed in the semiconductor substrate 100e adjacent to or abutting a back side 101b of the semiconductor substrate 100e. The semiconductor device 10E may further include fourth P-type regions 140 and fifth P-type regions 150 formed in the semiconductor substrate 100e adjacent to or abutting a front side 101f of the semiconductor substrate 100e.

The fourth P-type regions 140 and the fifth P-type regions 150 on the front side 101f may be symmetrically formed with respect to the first P-type regions 110 and the second P-type regions 120 on the back side 101b. The fourth P-type regions 140 may be formed to extend from the front side 101f toward an inside of the semiconductor substrate 100e. The fourth P-type regions 140 may be symmetrically formed with respect to the first P-type regions 110 in the semiconductor substrate 100e.

The fourth P-type regions 140 may include boron. The concentration of boron in the fourth P-type regions 140 may be the same as that in the first P-type regions 110. The fourth P-type regions 140 and the N-type regions 180 may form PN diodes. The fifth P-type regions 150 may be formed between the fourth P-type regions 140. Lower portions of the fifth P-type regions 150 may be formed adjacent to or abutting the back side 101b.

A portion of each of left-side surfaces of the fifth P-type regions 150 may be in contact with a corresponding adjacent right-side surface of the fourth P-type regions 140. A portion of each of right-side surfaces of the fifth P-type regions 150 may be in contact with a corresponding adjacent left-side surface of the fourth P-type regions 140. The fifth P-type regions 150 may be horizontally spaced from the N-type regions 180. The fifth P-type regions 150 may have a greater vertical thickness than the fourth P-type regions 140, and may have a lesser vertical thickness than the N-type regions 180.

The fifth P-type regions 150 may be narrower in maximum horizontal width than the fourth P-type regions 140 and the N-type regions 180. A lowermost level of the fifth P-type regions 150 may be lower that a lowermost level of the N-type regions 180. The fifth P-type regions 150 may be symmetrically formed with respect to the second P-type regions 120 in the semiconductor substrate 100e. The fifth P-type regions 150 may include boron.

The concentration of boron in the fifth P-type regions 150 may be higher than that in the fourth P-type regions 140. The concentration of boron in the fifth P-type regions 150 may be the same as that in the second P-type regions 120. The fifth P-type regions 150 may reduce crosstalk between neighboring N-type regions 180 to improve quantum efficiency due to light in each of the N-type regions 180.

Figure 1F:
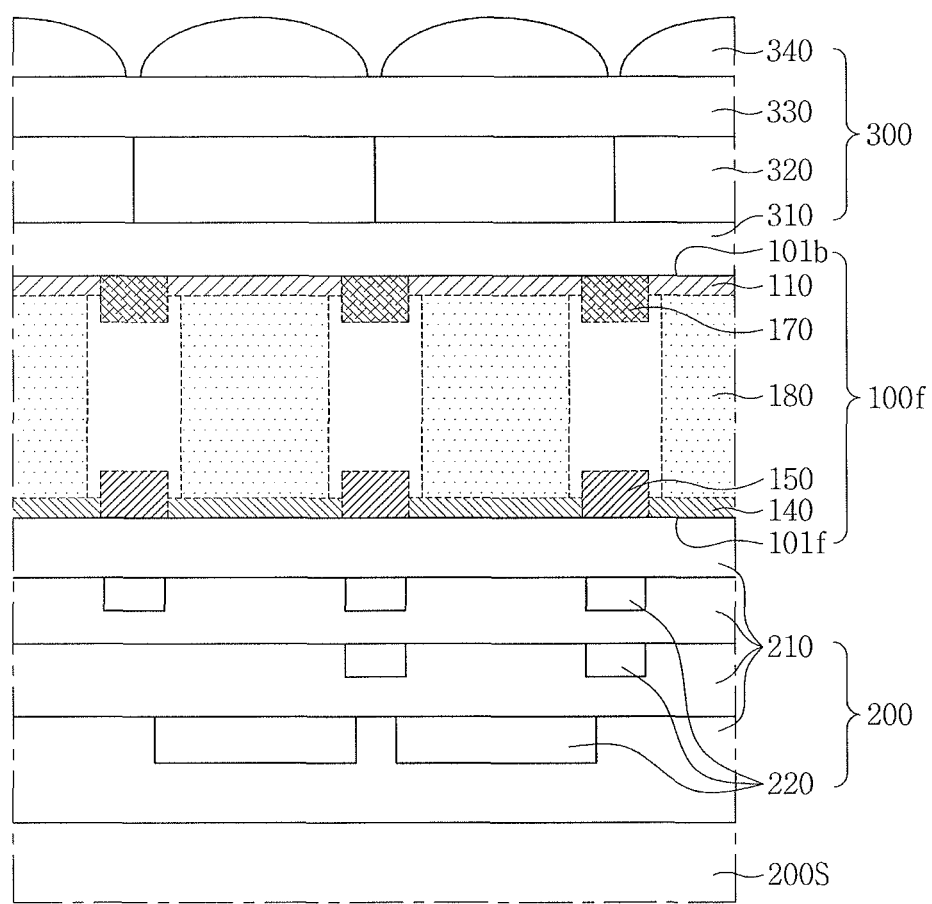

FIG. 1F illustrates a longitudinal section schematically showing a semiconductor device according to another exemplary embodiment.

Referring to FIG. 1F, a semiconductor device 10F according to this exemplary embodiment may include a semiconductor substrate 100f, an interconnection portion 200 under the semiconductor substrate 100f, a supporting substrate 200S under the interconnection portion 200, and a light-receiving portion 300 on the semiconductor substrate 100f.

The semiconductor device 10F may include first P-type regions 110 formed in the semiconductor substrate 100f and formed adjacent to or abutting a back side 101b of the semiconductor substrate 100f, and amorphous impurity regions 170 between the first P-type regions 110. The semiconductor device 10F may further include fourth P-type regions 140 formed in the semiconductor substrate 100f and formed adjacent to or abutting a front side 101f of the semiconductor substrate 100f, and fifth P-type regions 150 between the fourth P-type regions 140.

The fourth P-type regions 140 and the fifth P-type regions 150 may include boron. The fourth P-type regions 140 and the fifth P-type regions 150 may reduce crosstalk between neighboring N-type regions 180 to improve quantum efficiency due to light in each of the N-type regions 180.

Figure 1G:
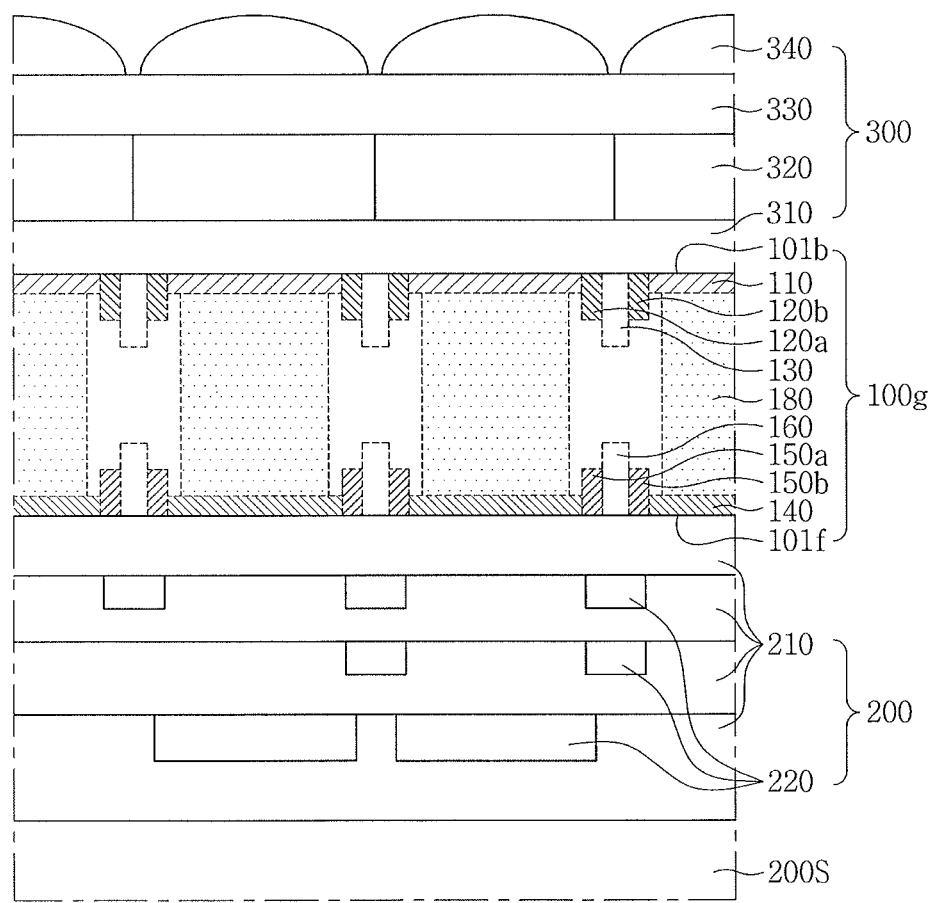

FIG. 1G illustrates a longitudinal section schematically showing a semiconductor device according to another exemplary embodiment.

Referring to FIG. 1G, a semiconductor device 10G according to this exemplary embodiments may include a semiconductor substrate 100g, an interconnection portion 200 under the semiconductor substrate 100g, a supporting substrate 200S under the interconnection portion 200, and a light-receiving portion 300 on the semiconductor substrate 100g.

The semiconductor device 10G may further include first P-type regions 110 formed in the semiconductor substrate 100g adjacent to or abutting a back side 101b of the semiconductor substrate 100g, second P-type separation regions 120a and 120b between the first P-type regions 110, and third P-type regions 130 between the second P-type separation regions 120a and 120b.

The semiconductor device 10G may further include fourth P-type regions 140 formed in the semiconductor substrate 100g adjacent to or abutting a front side 101f, fifth P-type separation regions 150a and 150b formed between the fourth P-type regions 140, and sixth P-type regions 160 formed between the fifth P-type separation regions 150a and 150b.

The first P-type regions 110, the second P-type separation regions 120a and 120b, and the third P-type regions 130 in the back side 101b may be symmetrically formed with respect to the fourth P-type regions 140, the fifth P-type separation regions 150a and 150b, and the sixth P-type regions 160 in the front side 101f, respectively. The sixth P-type regions 160 may be formed adjacent to or abutting the front side 101f of the semiconductor substrate 100g.

A portion of each of left-side surfaces of the sixth P-type regions 160 may be in contact with a corresponding adjacent right-side surface of the fifth P-type separation regions 150a. A portion of each of right-side surfaces of the sixth P-type regions 160 may be in contact with a corresponding adjacent left-side surface of the fifth P-type separation regions 150b. The sixth P-type regions 160 may be horizontally spaced from the N-type regions 180.

The sixth P-type regions 160 may have a greater vertical thickness than the fifth P-type separation regions 150a and 150b, and may have a lesser vertical thickness than the N-type regions 180. The sixth P-type regions 160 may be narrower in maximum horizontal width than the N-type regions 180. A lowermost level of the sixth P-type regions 160 may be lower than a lowermost level of the N-type regions 180. The fifth P-type separation regions 150a and 150b, and the sixth P-type regions 160 may include boron.

The sixth P-type regions 160 may have a higher impurity concentration than the fifth P-type separation regions 150a and 150b. The fifth P-type separation regions 150a and 150b may have a higher impurity concentration than the fourth P-type regions 140. The fifth P-type separation regions 150a and 150b, and the sixth P-type regions 160 may reduce crosstalk between neighboring N-type regions 180 to improve quantum efficiency due to light in each of the N-type regions 180.

Figure 1H:
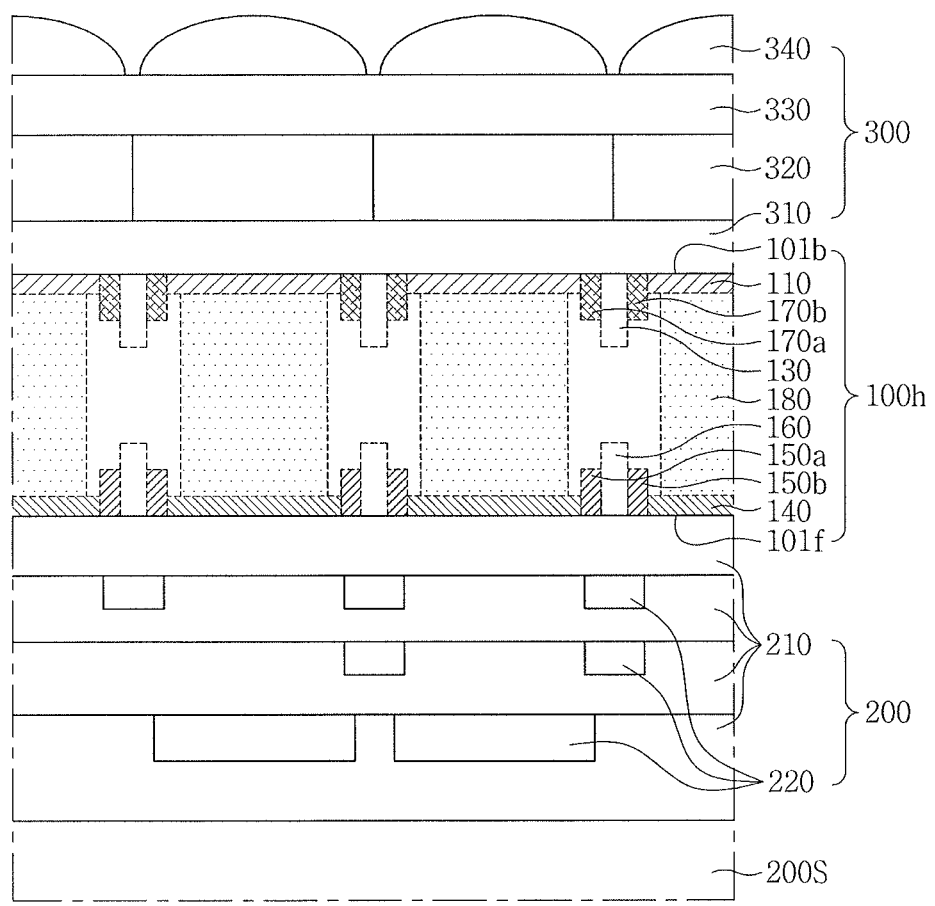

FIG. 1H illustrates a longitudinal section schematically showing a semiconductor device according to another exemplary embodiment.

Referring to FIG. 1H, a semiconductor device 10H according to this exemplary embodiments may include a semiconductor substrate 100h, an interconnection portion 200 under the semiconductor substrate 100h, and a light-receiving portion 300 on the semiconductor substrate 100h.

The semiconductor device 1014 may include first P-type regions 110 formed in the semiconductor substrate 100h adjacent to or abutting a back side 101b of the semiconductor substrate 100h, amorphous impurity separation regions 170a and 170b between the first P-type regions 110, and third P-type regions 130 between the amorphous impurity separation regions 170a and 170b.

The semiconductor device 10H may further include fourth P-type regions 140 formed in the semiconductor substrate 100h adjacent to or abutting the front side 101f of the semiconductor substrate 100h, fifth P-type separation regions 150a and 150b between the fourth P-type regions 140, and sixth P-type regions 160 between the fifth P-type separation regions 150a and 150b.

The amorphous impurity separation regions 170a and 170b, the third P-type regions 130, and the fifth P-type separation regions 150a and 150b may reduce crosstalk between neighboring N-type regions 180 to improve quantum efficiency due to light in each of the N-type regions 180.

FIGS. 2A to 2K illustrate longitudinal sections illustrating stages of a method of fabricating a semiconductor device according to an exemplary embodiment.

Figure 2A:
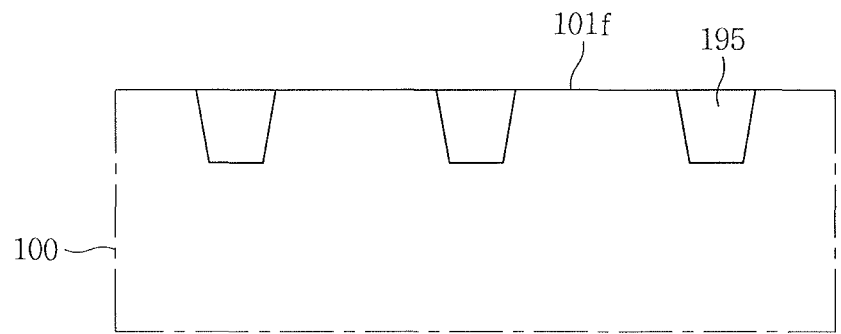
FIGS. 2A to 2K illustrate longitudinal sections depicting stages of a method of fabricating a semiconductor device according to an exemplary embodiment.

Referring to FIG. 2A, a method of fabricating a semiconductor device 10A according to this exemplary embodiment may include forming insulating patterns 195 in a semiconductor substrate 100. The semiconductor substrate 100 may be a single crystalline silicon substrate, in which a P-type impurity is blanketly implanted with low concentration. The semiconductor substrate 100 may have a front side 101f as an upper surface thereof. The insulating patterns 195 may be formed using a technique for forming a shallow trench isolation (STI).

Figure 2B:
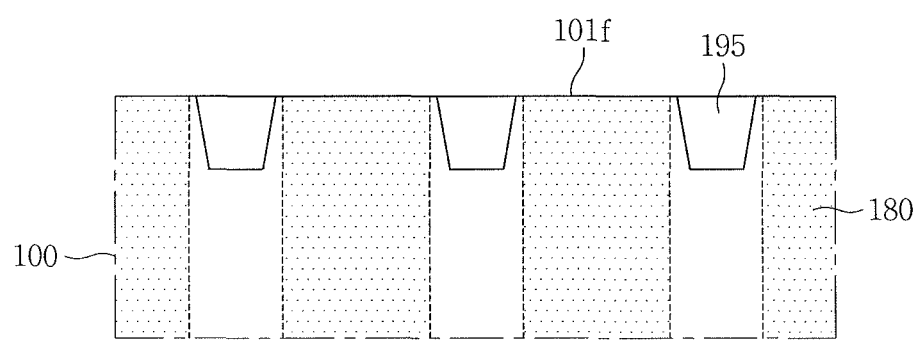

Referring to FIG. 2B, the method may include forming N-type regions 180 between the insulating patterns 195 in the semiconductor substrate 100. The N-type regions 180 may include an N-type impurity, such as phosphorus (P) or arsenic (As), etc. The N-type regions 180 may be regions capable of receiving light and generating electrons therein.

The N-type regions 180 may be horizontally spaced from the insulating patterns 195. The N-type regions 180 may be formed to be spaced from the insulating patterns 195 to reduce the likelihood of or prevent electrons generated in the N-type regions 180 from combining with defective sites that may exist in inclined surfaces of the insulating patterns 195 and causing a leakage between the N-type regions 180 and the insulating patterns 195.

Figure 2C:
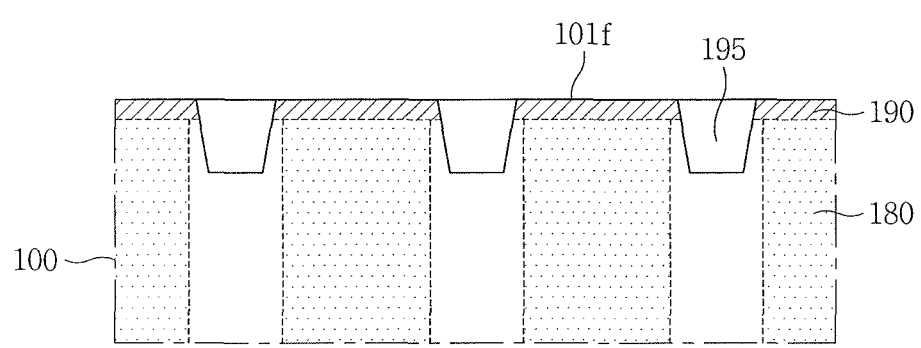

Referring to FIG. 2C, the method may include forming frontal P-type regions 190. The frontal P-type regions 190 may be formed to extend from the front side 101f of the semiconductor substrate 100 toward the inside of the semiconductor substrate 100. The frontal P-type regions 190 may be formed by performing an ion implantation technique. The frontal P-type regions 190 may include boron. The frontal P-type regions 190 may be formed by blanketly implanting impurities on the front side 101f of the semiconductor substrate 100.

The frontal P-type regions 190 may be partially formed in the N-type regions 180 to form PN diodes together with the N-type regions 180. The frontal P-type regions 190 may reduce leakage due to the combination of the electrons generated in the N-type regions 180 with defective sites that may exist in the front side 101f of the semiconductor substrate 100.

Figure 2D:
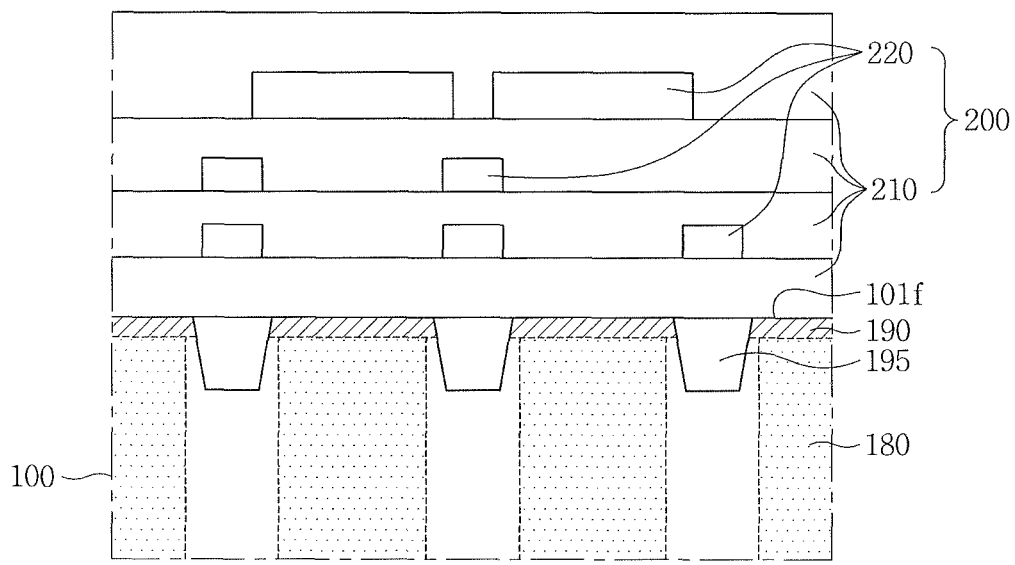

Referring to FIG. 2D, the method may include forming an interconnection portion 200 on the semiconductor substrate 100. The formation of the interconnection portion 200 may include forming interlayer insulating layers 210 and conductive patterns 220 on the semiconductor substrate 100. The interlayer insulating layers 210 may insulate between the semiconductor substrate 100 and the conductive patterns 220. The interlayer insulating films 210 may insulate between the conductive patterns 220.

The interlayer insulating layers 210 may include silicon oxide or silicon nitride. The interlayer insulating layers 210 may be formed using a suitable chemical vapor deposition (CVD) technique. The conductive patterns 220 may be formed to include a plurality of layers. For example, the conductive patterns 220 may be formed to include more than three layers. The conductive patterns 220 may include conductive material, such as aluminum (Al) or copper (Cu), etc.

The formation of the conductive patterns 220 may include using a sputtering or damascene technique. A portion of the conductive patterns 220 may be used as a reflective layer. The reflective layer may reflect a portion of light not contributing to the generation of electrons and transmitted in the N-type regions to improve quantum efficiency in the N-type regions 180.

Figure 2E:
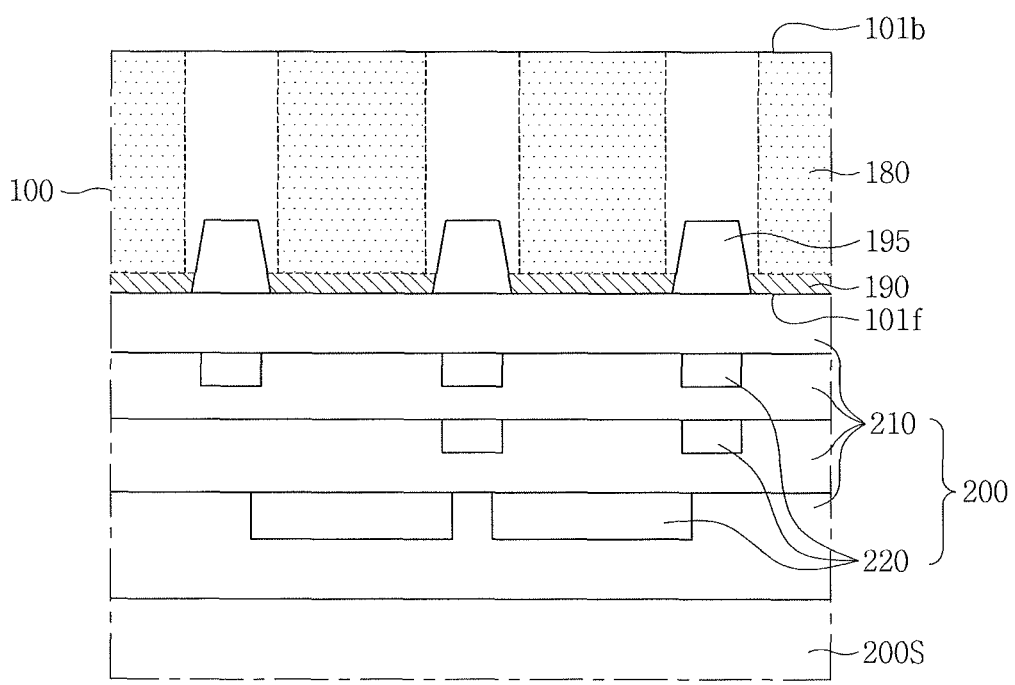

Referring to FIG. 2E, the method may include turning over the semiconductor substrate 100 and the interconnection portion 200 such that the interconnection portion 200 and the semiconductor substrate 100 are sequentially stacked on a supporting substrate 200S, and partially removing a back side 101b of the semiconductor substrate 100. The partial removal of the back side 101b of the semiconductor substrate 100 may include using a back grinding technique or an etching technique.

The back side 101b of the semiconductor substrate 100 may be located on an uppermost level according to the orientation shown in FIG. 2E. The supporting substrate 200S may support the partially thinned semiconductor substrate 100 to improve stability in subsequent processes.

Figure 2F:
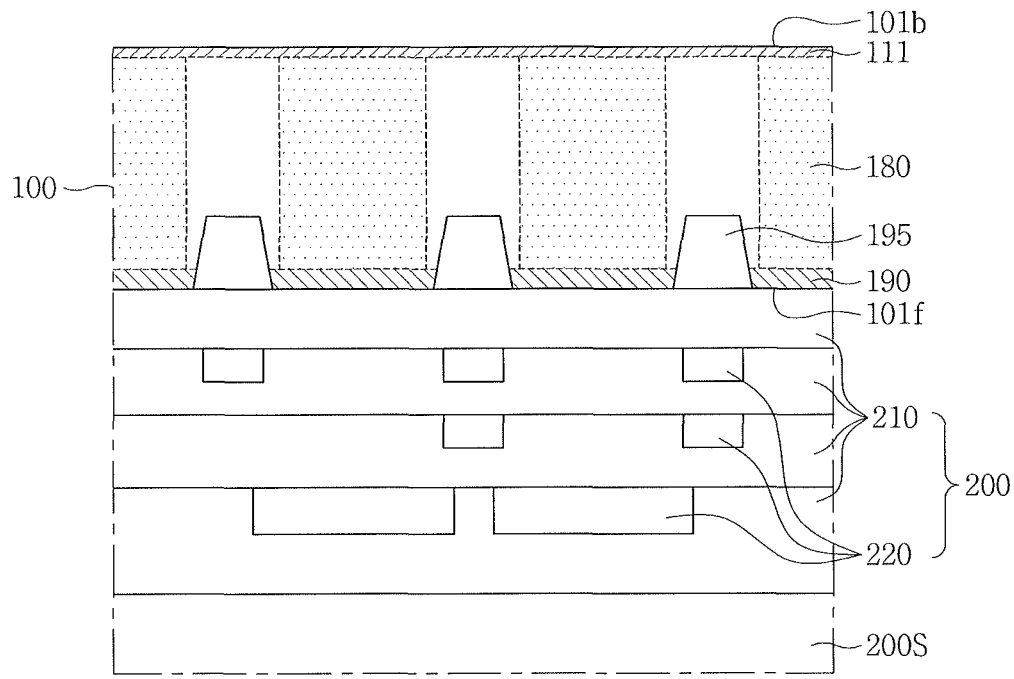

Referring to FIG. 2F, the method may include forming a first P-type implantation region 111 in the semiconductor substrate 100. The first P-type implantation region 111 may be blanketly formed under the back side 101b of the semiconductor substrate 100. The first P-type implantation region 111 may be formed from the back side 101b toward the inside of the semiconductor substrate 100. The formation of the first P-type implantation region 111 may include using an ion implantation technique or a pulsed plasma doping technique.

The ion implantation technique may be performed by accelerating impurities using an electric field to implant the impurities into the semiconductor substrate 100. The pulsed plasma doping technique may be performed to excite impurities and transform the impurities into plasma to implant a portion of the plasma into the semiconductor substrate 100.

A source gas of the impurities used in the pulsed plasma doping technique may be boron fluoride (BF), di-borane ($B_2H_6$), or other compounds containing boron (B) and hydrogen (H). As an example, the pulsed plasma doping technique may be performed using a dosage of about 1.0E13 to about 1.0E20 atoms/cm$^2$ with about 1 keV to about 7 keV in energy.

Figure 2G:
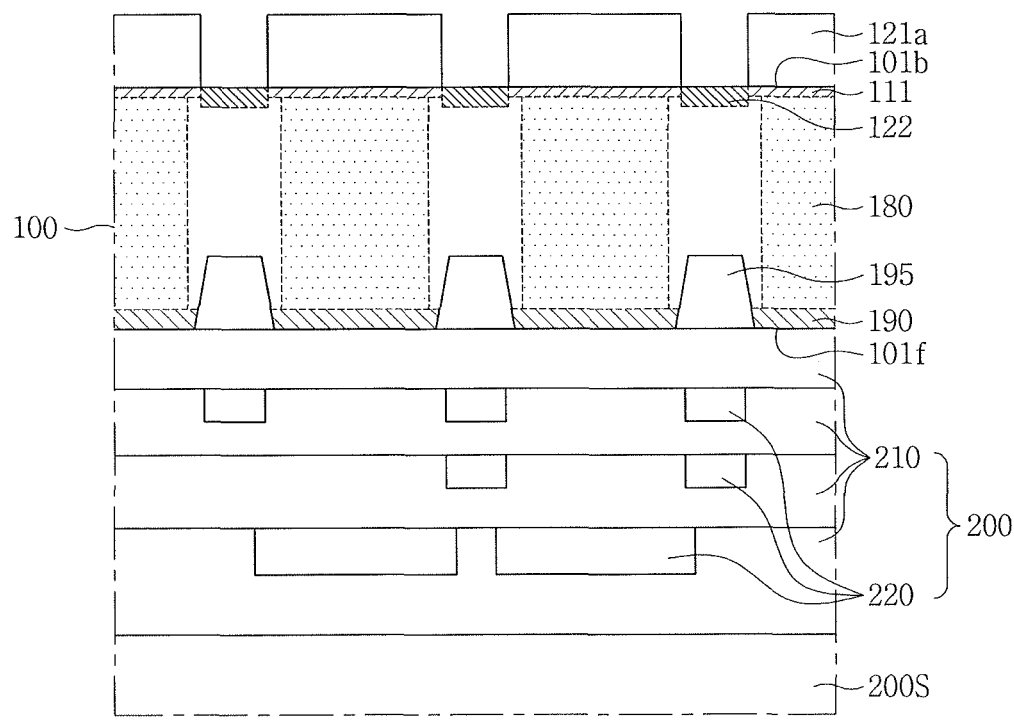

Referring to FIG. 2G, the method may include forming second P-type implantation regions 122 in the semiconductor substrate 100. The formation of the second P-type implantation regions 122 may include using a photolithography technique. The photolithography technique may include forming a plurality of first photoresist patterns 121a on the semiconductor substrate 100.

Each of the first photoresist patterns 121a may be wider in a maximally horizontal width than each of the N-type regions 180. Left-side surfaces of the first photoresist patterns 121a may be spaced apart from left-side surfaces of the N-type regions 180. Right-side surfaces of the first photoresist patterns 121a may be spaced apart from right-side surfaces of the N-type regions 180.

The second P-type implantation regions 122 may be formed between the N-type regions 180, for example, between the first photoresist patterns 121a in the semiconductor substrate 100. The second P-type implantation regions 122 may be in contact with the back side 101b of the semiconductor substrate 100. The second P-type implantation regions 122 may be horizontally spaced from the N-type regions 180. The second P-type implantation regions 122 may have a greater vertical thickness than the first P-type implantation region 111.

The second P-type implantation regions 122 may be narrower in maximum horizontal width than the N-type regions 180. An uppermost level of the second P-type implantation regions 122 may be higher than the uppermost level of the N-type regions 180. The center of each of the second P-type implantation regions 122 may be in a vertically overlapping and aligned relationship with the center of each of the insulating patterns 195.

The formation of the second P-type implantation regions 122 may include using the same ion implantation or pulsed plasma doping technique used in the formation of the first P-type implantation region 111. When the ion implantation or pulsed plasma doping technique is performed, the second P-type implantation regions 122 may be formed by implanting impurities into the semiconductor substrate 100 with higher energy than used in the formation of the first P-type implantation region 111.

In other embodiments, the second P-type implantation regions 122 may be formed using the ion implantation or pulsed plasma doping technique with the same energy used in the formation of the first P-type implantation region 111. Thus, the second P-type implantation regions 122 may have the same depth as the first P-type implantation region 111 in the semiconductor substrate 100. In another implementation, the second P-type implantation regions 122 may be formed using the ion implantation or pulsed plasma doping technique with lower energy than when compared with that used in the formation of the first P-type implantation region 111.

Thus, the second P-type implantation regions 122 may have a thinner depth than the first P-type implantation region 111 in the semiconductor substrate 100. The second P-type implantation regions 122 may have a higher impurity implanting concentration than the first P-type implantation region 111. For example, when an impurity implanting concentration of the first P-type implantation region 111 is about 1.0E14 atoms/cm$^2$, an impurity implanting concentration of the second P-type implantation regions 122 may be about 1.0E15 atoms/cm$^2$.

In other implementations, the second P-type implantation regions 122 may have the same impurity implanting concentration as the first P-type implantation region 111.

Figure 2H:
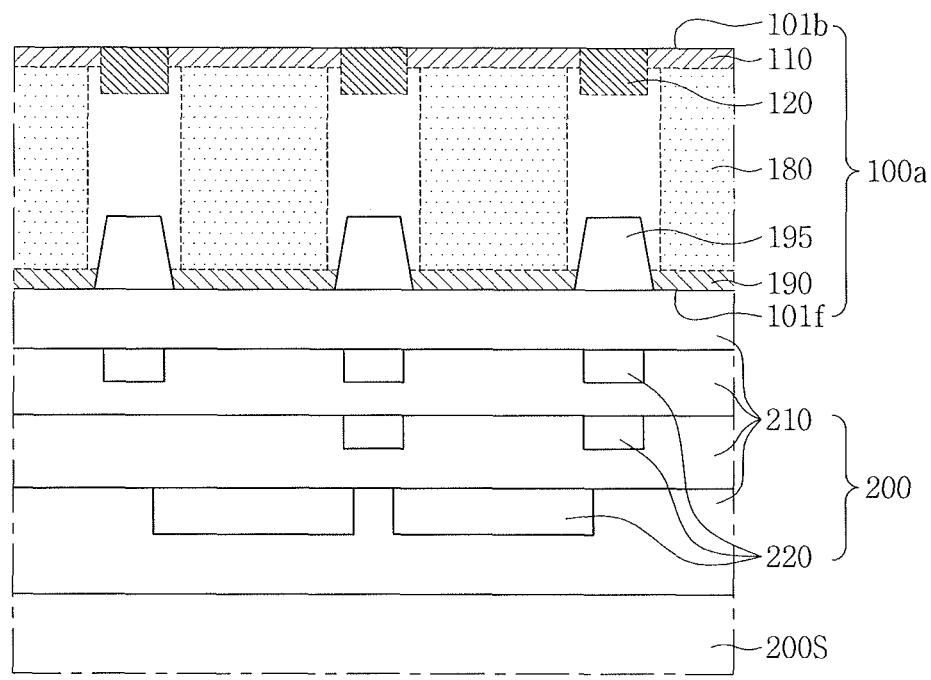

Referring to FIG. 2H, the method may include forming a substrate 100a that has first P-type regions 110 and second P-type regions 120 formed therein. The formation of the first P-type regions 110 and the second P-type regions 120 may include using a laser annealing technique. The first P-type regions 110 and the second P-type regions 120 may be formed by applying the laser annealing technique to the first P-type implantation region 111 and the second P-type implantation regions 122 to activate and diffuse the first P-type implantation region 111 and the second P-type implantation regions 122.

The laser annealing technique may be performed using a blue gas laser including xenon chloride (XeCl) or a DPSS (diode pumped solid state) green laser including neodymium-doped yttrium aluminum garnet (Nd:YAG), neodymium-doped yttrium orthovanadate (Nd:YVO4), etc. The laser annealing technique may be applied simultaneously to the first P-type implantation region 111 and the second P-type implantation regions 122.

For example, the laser annealing technique may be performed using a pulse of instantaneous energy greater than the melting temperature of silicon. That is, because silicon is instantaneously melted, an annealed effect may be obtained through the performance of the laser annealing technique. The laser annealing technique may be performed for a very short time so as to not damage neighboring patterns with an impurity implanted region, and so as to activate and diffuse only the impurity implanted region.

The laser annealing technique may change a diffused depth of the impurity implanted region according to an impurity concentration of the impurity implanted region. As the impurity concentration becomes higher, an amorphous region becomes more enlarged by impurities in the semiconductor substrate 100. As the amorphous region becomes larger, the diffused depth of the impurities may be deepened through the performance of the laser annealing technique.

An enlarged rate of the second P-type implantation regions 122 may be larger than an enlarged rate of the first P-type implantation region 111. As a result, the second P-type implantation regions 120 may be diffused from a surface of the substrate 100*a* more deeply compared to the first P-type regions 110. The first P-type regions 110 may be formed closer to the surface of the semiconductor substrate 100*a* compared to the second P-type implantation regions 120.

The second P-type implantation regions 120 may be formed to have a higher impurity concentration than the first P-type regions 110. In other implementations, the first P-type regions 110 and the second P-type implantation regions 120 may be formed to have the same impurity concentration. In other implementations, the first P-type regions 110 and the second P-type implantation regions 120 may be formed to have an impurity concentration to the extent of about 1.0E14 atoms/cm$^2$ to about 1.0E20 atoms/cm$^2$.

The first P-type regions 110 may reduce dark current leaked into the back side 101*b* by electrons that may be generated in the N-type regions 180 due to incident light through the light-receiving portion 300 (refer, for example, to FIG. 1A). When the first P-type regions 110 are formed to have a suitable concentration and depth, the amount of the electrons generated by the incident light in the N-type regions 180 may be adjusted. Accordingly, there may be a reduced white pixel defect, etc., which may occur by electrons excessively generated in the N-type regions 180.

The second P-type implantation regions 120 may be formed deeper than the first P-type regions 110. Accordingly, the second P-type implantation regions 120 may reduce crosstalk, in which electrons generated due to the incident light in specific N-type regions 180 may drift into neighboring N-type regions 180. The second P-type implantation regions 120 may reduce crosstalk to improve quantum efficiency due to the incident light in the N-type regions 180.

Figure 2I:
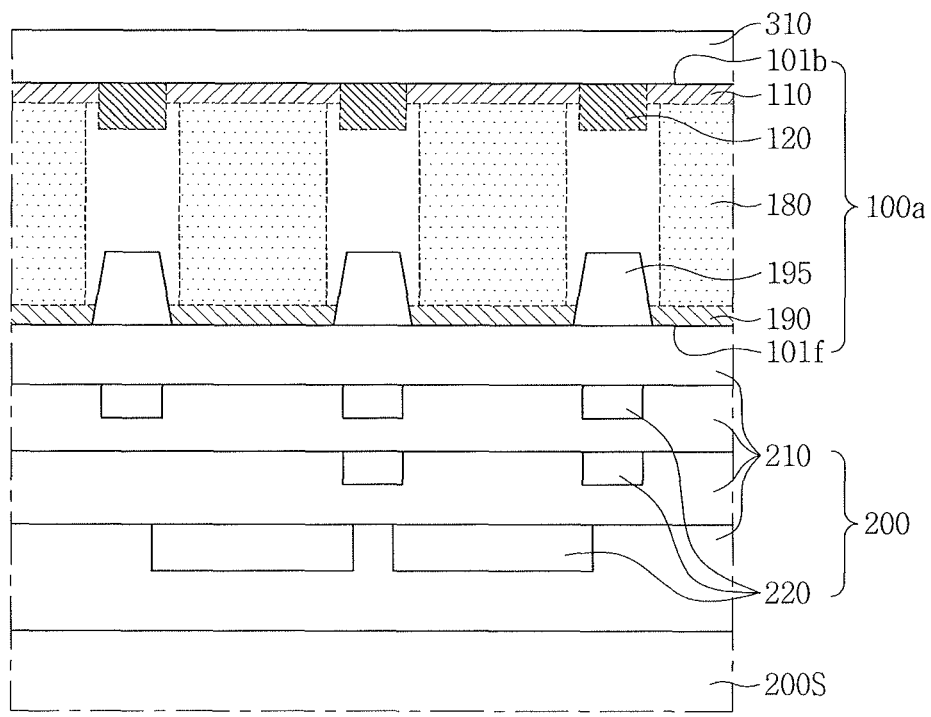

Referring to FIG. 2I, the method may include forming a passivation layer 310 on the back side 101*b* of the semiconductor substrate 100*a*. The passivation layer 310 may include silicon nitride. The passivation layer 310 may be formed to protect the semiconductor substrate 100*a*. The formation of the passivation layer 310 may include using a chemical vapor deposition technique.

Figure 2J:
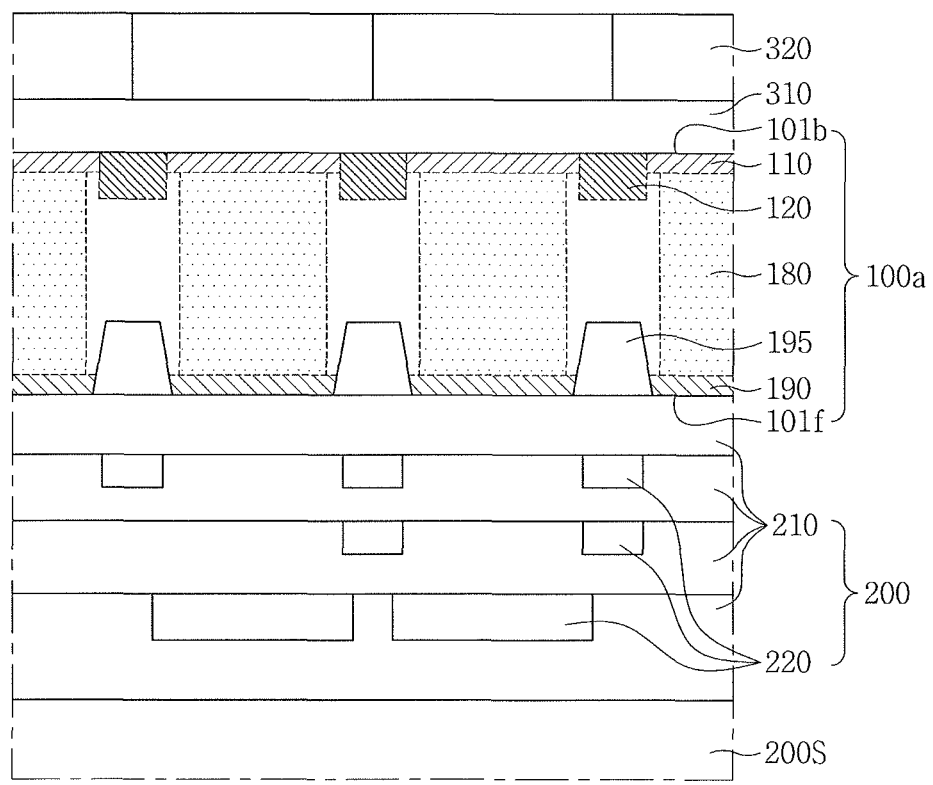

Referring to FIG. 2J, the method may include forming color filters 320 on the passivation layer 310. The color filters 320 may be formed to be arranged in a repeated pattern in a transverse direction. The color filters 320 may include a photosensitive resin representing a red, green or blue color. The formation of the color filters 320 may include using a photolithography technique. Each of the color filters 320 may pass only a portion of light corresponding to the color thereof, and reflect the remaining portion of the light not corresponding to the color thereof.

Figure 2K:
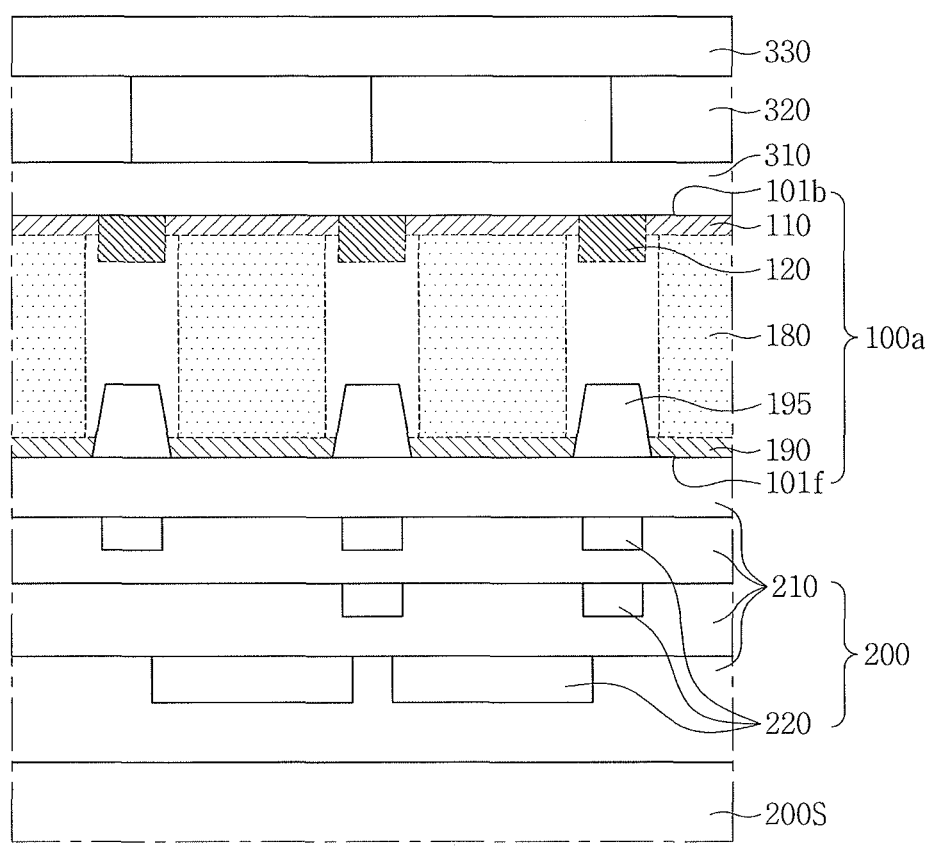

Referring to FIG. 2K, the method may include forming a planarization layer 330 on the color filters 320. The planarization layer 330 may reduce step differences of top surfaces of the color filters 320 to contribute to uniformly forming microlenses 340 above the color filters 320 as shown in FIG. 1A. The microlenses 340 may be formed to have a curved shape on top surfaces thereof in order to pass a maximal amount of light illuminated thereon to the N-type regions 180.

Accordingly, the method may include forming the microlenses 340 on the planarization layer 330 to complete the semiconductor device 10A of FIG. 1A

Figure 3A:
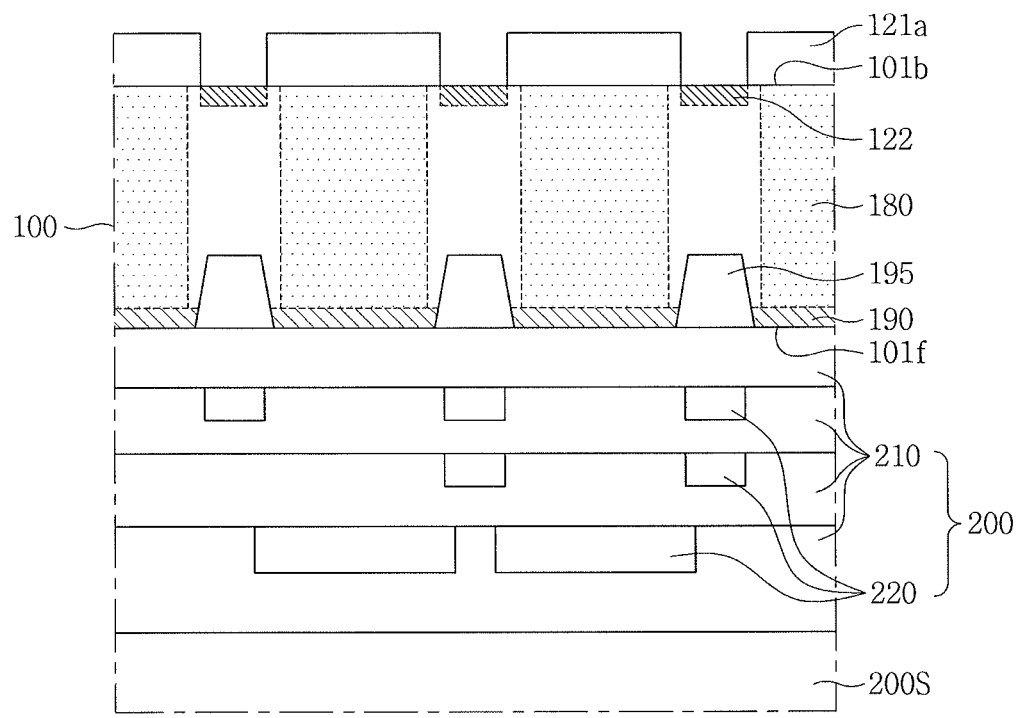
FIGS. 3A and 3B illustrate longitudinal sections depicting stages of a method of fabricating a semiconductor device according to an exemplary embodiment.
Figure 3B:
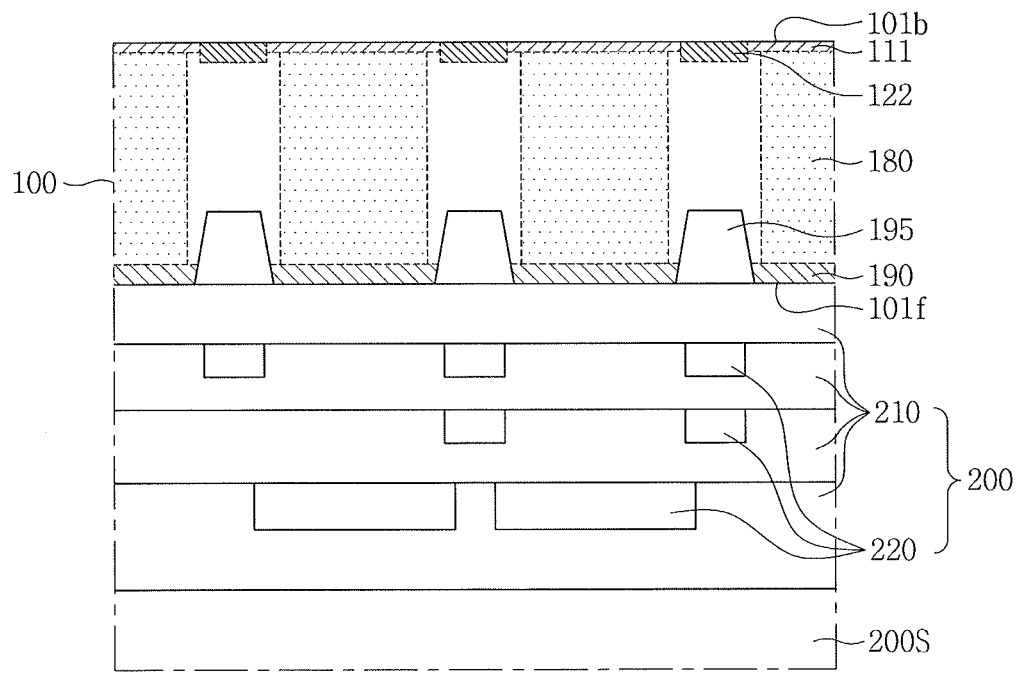

FIGS. 3A and 3B illustrate longitudinal sections depicting stages of a method of fabricating a semiconductor device according to modification of an exemplary embodiment.

Referring to FIG. 3A, a method of fabricating a semiconductor device according to this exemplary embodiment may include, after the stages illustrated in FIGS. 2A to 2E, forming second P-type implantation regions 122 under the back side 101*b* in the semiconductor substrate 100. The formation of the second P-type implantation regions 122 may be as illustrated in FIG. 2G.

Referring to FIG. 3B, the method may include forming a first P-type implantation region 111 under the back side 101*b* in the semiconductor substrate 100. Then, the semiconductor device 10A of FIG. 1A may be completed by referring to the FIGS. 2H to 2K.

Figure 4A:
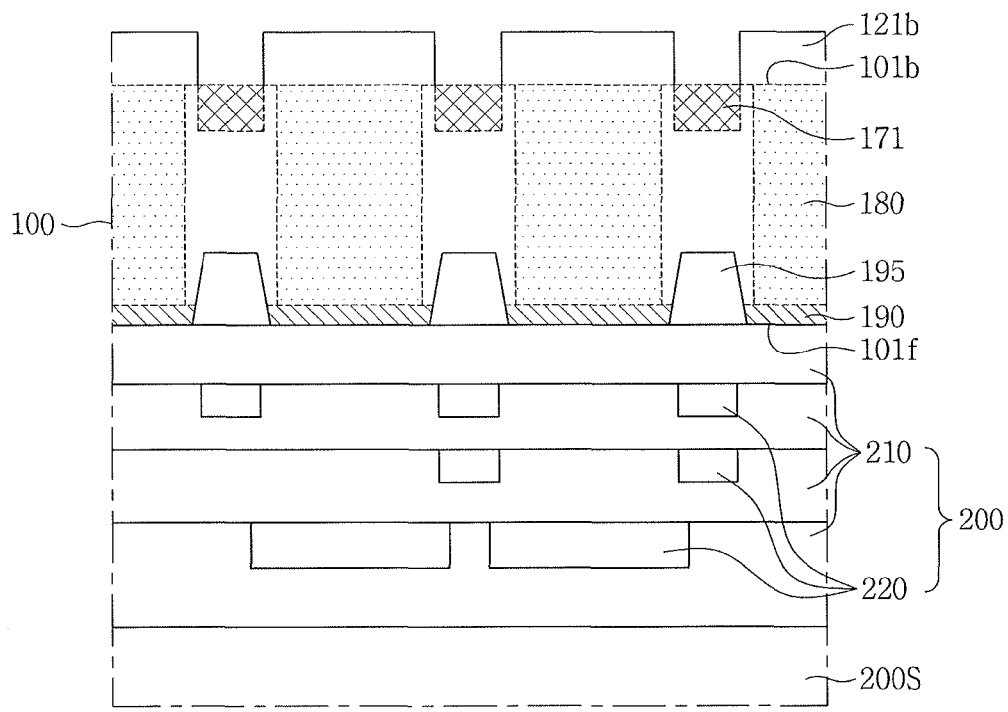
FIGS. 4A to 4C, 5A and 5B, 6A and 6B, 7A to 7E, 8A and 8B, 9A to 9E, and 10A to 10C illustrate longitudinal sections depicting stages of a method of fabricating semiconductor device according to various other exemplary embodiments.
Figure 4B:
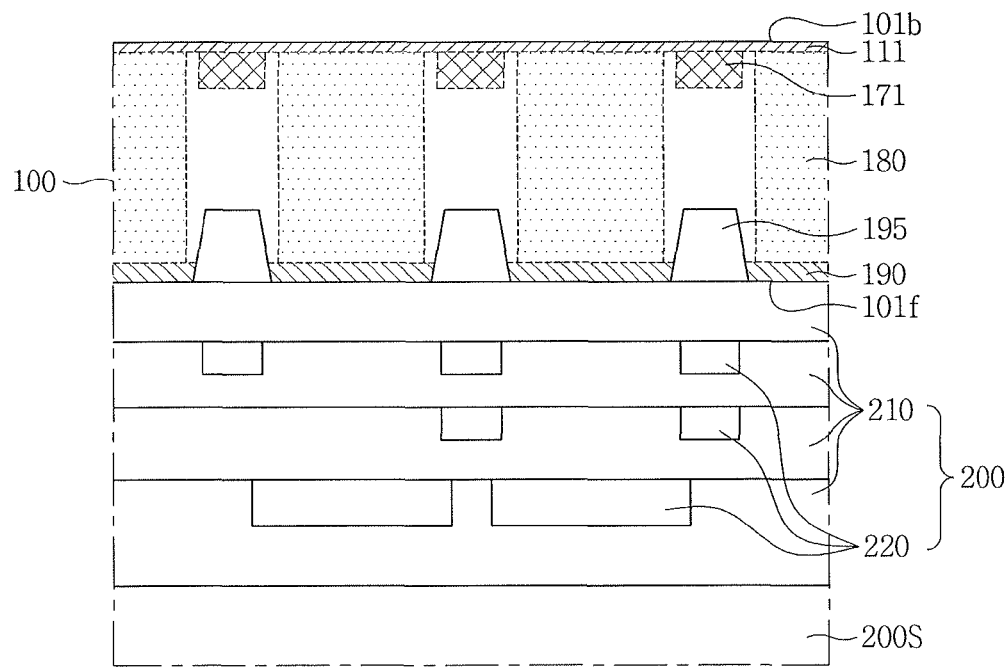
Figure 4C:
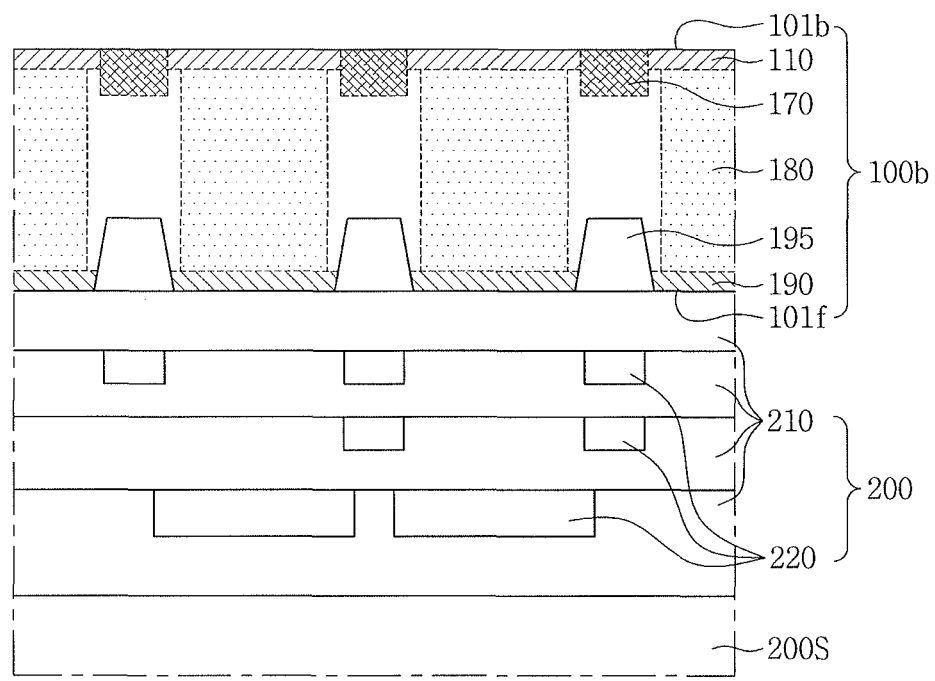

FIGS. 4A to 4C illustrate longitudinal sections depicting stages of a method of fabricating a semiconductor device according to another exemplary embodiment.

Referring to FIG. 4A, a method of fabricating a semiconductor device according to other various exemplary embodiments may include, after the stages illustrated in FIGS. 2A to 2E, forming amorphous impurity implantation regions 171 under the back side 101*b* in the semiconductor substrate 100. The formation of the amorphous impurity implantation regions 171 may include using a photolithography technique.

The performance of the photolithography technique may include forming a plurality of second photoresist patterns 121*b* on the back side 101*b*. Each of the second photoresist patterns 121*b* may be wider in a maximally horizontal width than each of the N-type regions 180. Left-side surfaces of the second photoresist patterns 121*b* may be spaced apart from left-side surfaces of the N-type regions 180. Right-side surfaces of the second photoresist patterns 121*b* may be spaced apart from right-side surfaces of the N-type regions 180.

The amorphous impurity implantation regions 171 may be formed between the N-type regions 180, for example, between the second photoresist patterns 121*b* in the semiconductor substrate 100. The amorphous impurity implantation regions 171 may be in contact with the back side 101*b*. The amorphous impurity implantation regions 171 may be horizontally spaced apart from the N-type regions 180. The amorphous impurity implantation regions 171 may have a lesser vertical thickness than the N-type regions 180.

The amorphous impurity implantation regions 171 may be narrower in maximum horizontal width than the N-type regions 180. An uppermost level of the amorphous impurity implantation regions 171 may be higher than an uppermost level of the N-type regions 180. The center of each of the amorphous impurity implantation regions 171 may be in an overlapping and aligned relationship with the center of each of the insulating patterns 195. The amorphous impurity implantation regions 171 may include one impurity, as illustrated in FIG. 1B.

The amorphous impurity implantation regions 171 may make it easier to activate and diffuse other impurities subsequently implanted therein.

Referring to FIG. 4B, the method may include forming a first P-type implantation region 111 in the semiconductor substrate 100. The formation of the first P-type implantation region 111 may be as illustrated in FIG. 2F.

Referring to FIG. 4C, the method may include forming a semiconductor substrate 100b that has first P-type regions 110 and amorphous impurity regions 170 formed therein. The formation of the first P-type regions 110 and the amorphous impurity regions 170 may include using a laser annealing technique. The first P-type regions 110 and the amorphous impurity regions 170 may be formed by activating and diffusing the first P-type implantation regions 111 and the amorphous impurity implantation regions 171 through the laser annealing technique.

The laser annealing technique may be as illustrated in FIG. 2H. The amorphous impurity regions 170 may include the one impurity implanted into the amorphous impurity regions 171, as described with reference to FIG. 1B, and boron. The concentration of boron in the amorphous impurity regions 170 may be the same as in the first P-type regions 110. Through the laser annealing technique, boron in the amorphous impurity implantation regions 171 may be diffused deeper into the inside of the semiconductor substrate 100b than the boron in the first P-type implantation regions 111.

Boron in the amorphous impurity implantation regions 171 may be diffused into the inside of the semiconductor substrate 100b to form the amorphous impurity regions 170. Then, the semiconductor device 10B of FIG. 1B may be completed by referring to FIGS. 2I to 2K.

Figure 5A:
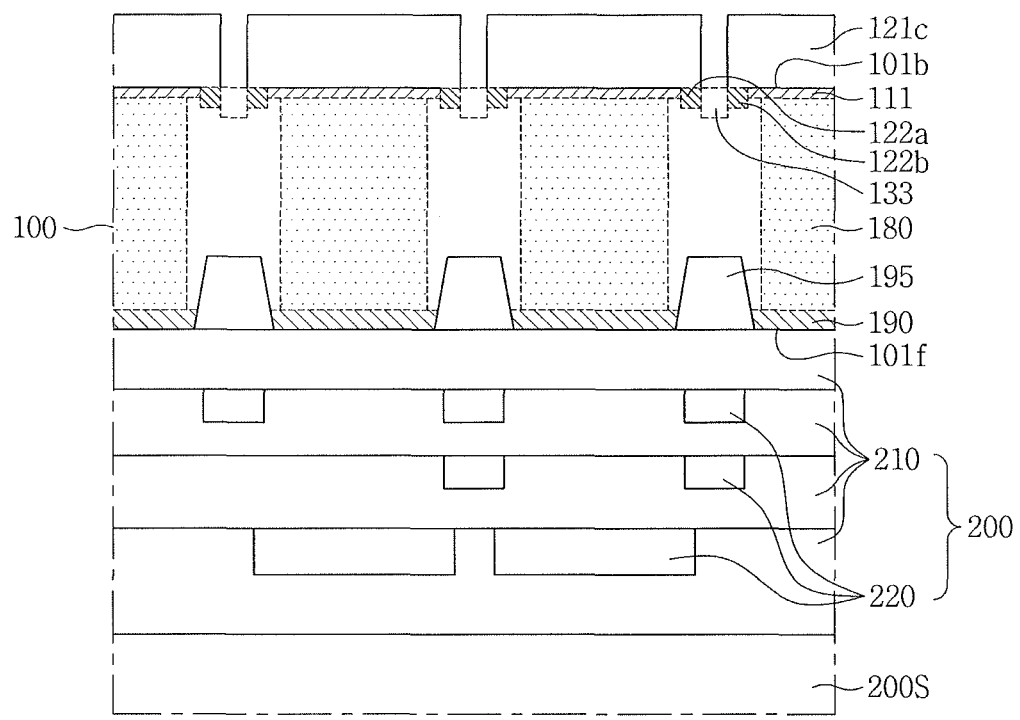
Figure 5B:
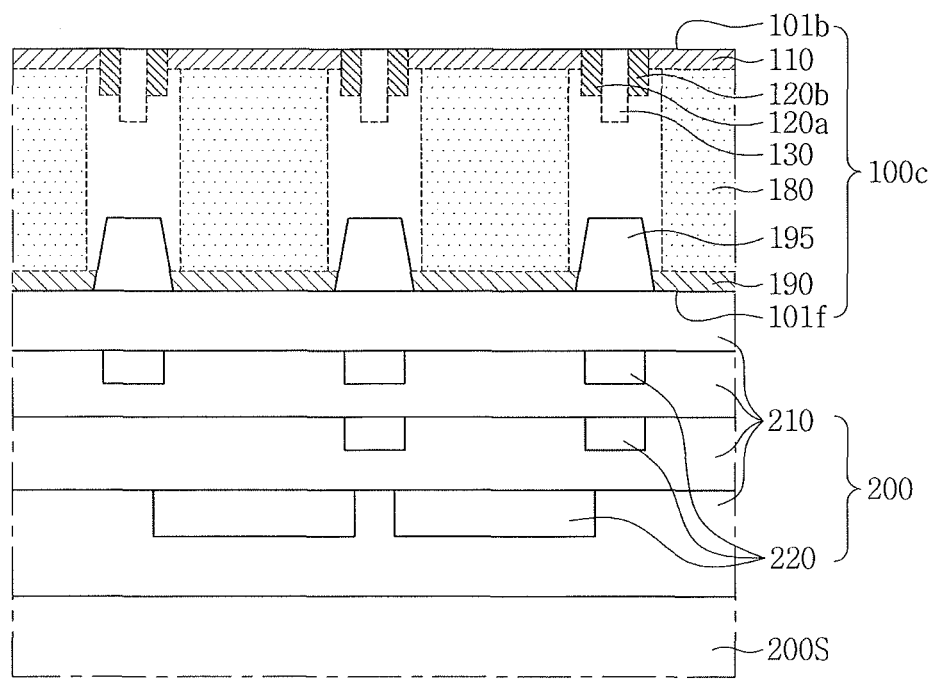

FIGS. 5A to 5C illustrate longitudinal sections depicting stages of a method of fabricating a semiconductor device according to another exemplary embodiment.

Referring to FIG. 5A, a method of fabricating a semiconductor device according to this exemplary embodiments may include, after the stages illustrated in FIGS. 2A to 2G, forming third P-type implantation regions 133 in the semiconductor substrate 100. The third P-type implantation regions 133 may divide the second P-type implantation regions 122 of FIG. 2G into first portions 122a and second portions 122b.

The formation of the third P-type implantation regions 133 may include using a photolithography technique. The performance of the photolithography technique may include forming a plurality of third photoresist patterns 121c on the semiconductor substrate 100. Each of the third photoresist patterns 121c may be wider in a maximally horizontal width than each of the first photoresist patterns 121a of FIG. 2G. The third P-type implantation regions 133 may be narrower in a maximally horizontal width than the second P-type implantation regions 122.

The third P-type implantation regions 133 may be formed between the N-type regions 180, for example, between the third photoresist patterns 121c in the semiconductor substrate 100. The third P-type implantation regions 133 may be in contact with the back side 101b in the semiconductor substrate 100. The third P-type implantation regions 133 may be horizontally spaced apart from the N-type regions 180.

The third P-type implantation regions 133 may have a greater vertical thickness than the first portions 122a and the second portions 122b. The third P-type implantation regions 133 may be narrower in a maximally horizontal width than the N-type regions 180. An uppermost level of the third P-type implantation regions 133 may be higher than an uppermost level of the N-type regions 180. The center of each of the third P-type implantation regions 133 may be in an overlapping and aligned relationship with the center of each of the insulating patterns 195.

The formation of the third P-type implantation regions 133 may include using the ion implantation technique or the pulse plasma doping technique as described in the formation of the second P-type implantation regions 122. When the ion implantation technique or the pulse plasma doping technique is performed, the third P-type implantation regions 133 may be formed by implanting impurities with higher energy, compared with the formation of the second P-type implantation regions 122.

The third P-type implantation regions 133 may also be formed by implanting impurities through the ion implantation technique or the pulse plasma doping technique with the same energy as compared with the formation of the second P-type implantation regions 122. Thus, the third P-type implantation regions 133 may have the same depth as the second P-type implantation regions 122.

In another implementation, the third P-type implantation regions 133 may be formed by implanting impurities through the ion implantation technique or the pulse plasma doping technique with lower energy, compared with the formation of the second P-type implantation regions 122. Thus, the third P-type implantation regions 133 may have a shallower depth than the second P-type implantation regions 122.

The third P-type implantation regions 133 may be higher in an impurity implanting concentration than the second P-type implantation regions 122. For example, the second P-type implantation regions 122 may have a dose of about $1.0E15$ atoms/cm$^2$, and the third P-type implantation regions 133 may have a dose of about $1.0E16$ atoms/cm$^2$. The second and third P-type implantation regions 122 and 133 may have a dose in the range of about $1.0E14$ atoms/cm$^2$ to about $1.0E20$ atoms/cm$^2$.

Referring to FIG. 5B, the method may include forming a semiconductor substrate 100c that has first P-type regions 110, second separation regions 120a and 120b, and third P-type regions 130 formed therein. The formation of the first P-type regions 110, the second separation regions 120a and 120b, and the third P-type regions 130 may include using a laser annealing technique.

The first P-type regions 110, the second separation regions 120a and 120b, and the third P-type regions 130 may be formed by activating and diffusing the first P-type implantation regions 111, the first portions 122a, the second portions 122b, and the third P-type implantation regions 133 through the laser annealing technique. The third P-type regions 130 may include boron.

The third P-type regions 130 have a higher boron concentration than the second separation regions 120a and 120b. Boron in the third P-type regions 130 may be diffused deeper into an inside of the semiconductor substrate 100c than in the second separation regions 120a and 120b through use of the laser annealing technique. Boron in the third P-type implantation regions 133 may be diffused into the semiconductor substrate 100c to form the third P-type regions 130.

Then, the semiconductor device 10C of FIG. 1C may be completed by referring to FIGS. 2I to 2K.

Figure 6A:
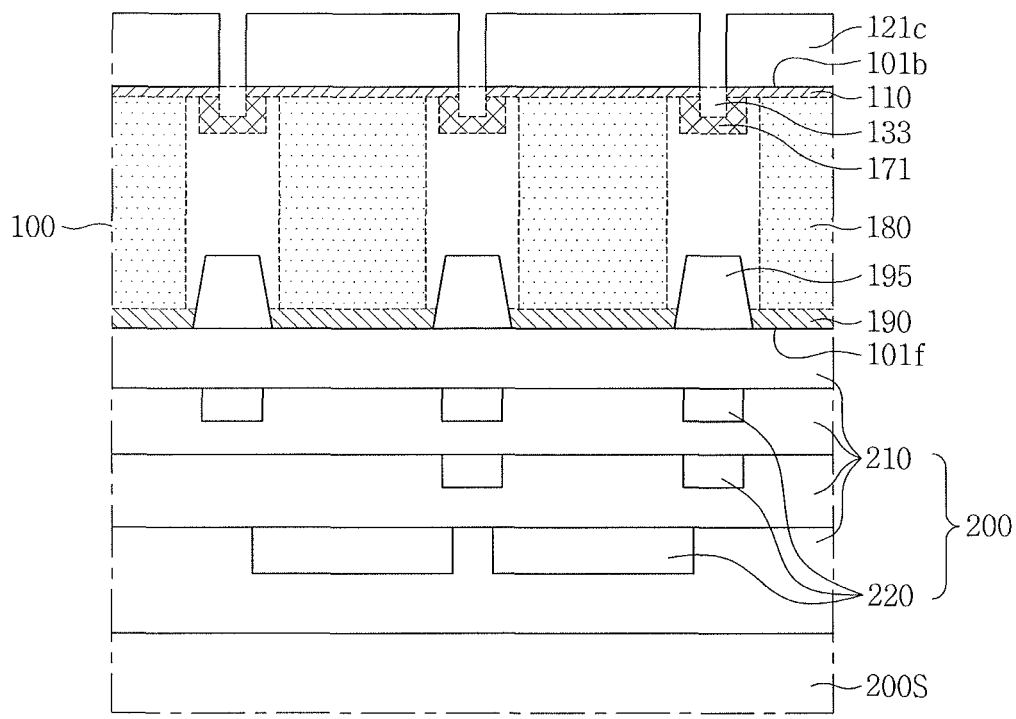
Figure 6B:
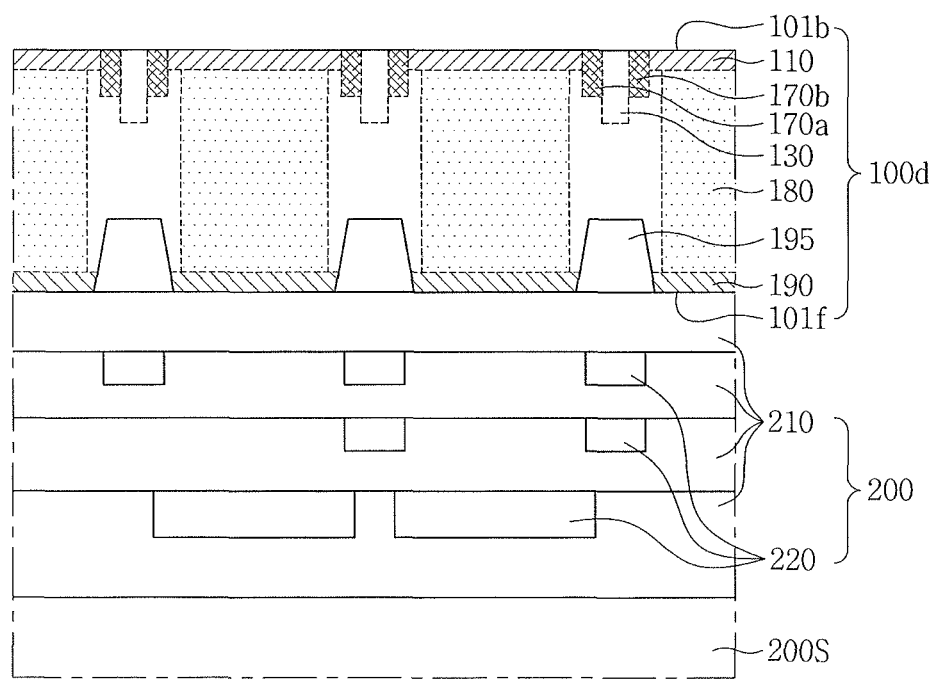

FIGS. 6A and 6B illustrate longitudinal sections depicting stages of a method of fabricating a semiconductor device according to another exemplary embodiment.

Referring to FIG. 6A, a method of fabricating a semiconductor device according to this exemplary embodiment may include, after the stages illustrated in FIGS. 2A to 2E, and FIGS. 4A to 4B, forming third P-type implantation regions 133 in the semiconductor substrate 100.

Referring to FIG. 6B, the method may include forming a semiconductor substrate 100d that has first P-type regions 110, amorphous impurity separation regions 170a and 170b, and third P-type regions 130 formed therein. The formation of the first P-type regions 110, the amorphous impurity separation regions 170a and 170b, and the third P-type regions 130 may include using a laser annealing technique.

The first P-type regions 110, the amorphous impurity separation regions 170a and 170b, and the third P-type regions 130 may be formed by activating and diffusing the first P-type implantation regions 111, the amorphous impurity implantation regions 171, and the third P-type implantation regions 133 through the laser annealing technique. Then, the semiconductor device 10D of FIG. 1D may be completed by referring to FIGS. 2I to 2K.

FIGS. 7A to 7E illustrate longitudinal sections depicting stages of a method of fabricating a semiconductor device according to another exemplary embodiment.

Figure 7A:
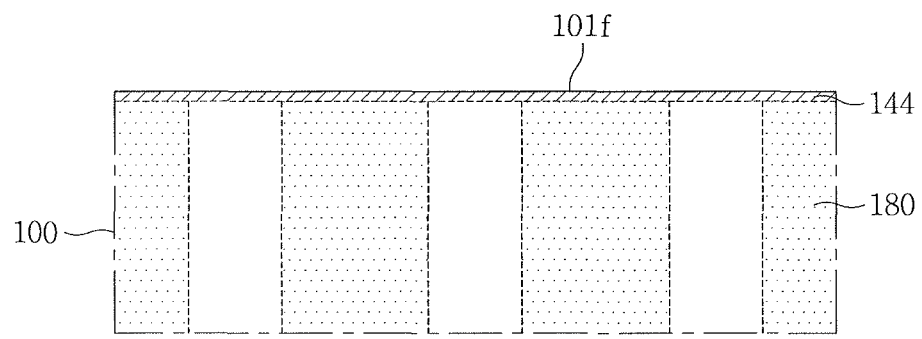

Referring to FIG. 7A, a method of fabricating a semiconductor device according to this exemplary embodiments may include, after the stages illustrated in FIGS. 2A and 2B, forming a fourth P-type implantation region 144 in the semiconductor substrate 100. The fourth P-type implantation region 144 may be blanketly formed under the front side 101f in the semiconductor substrate 100.

Figure 7B:
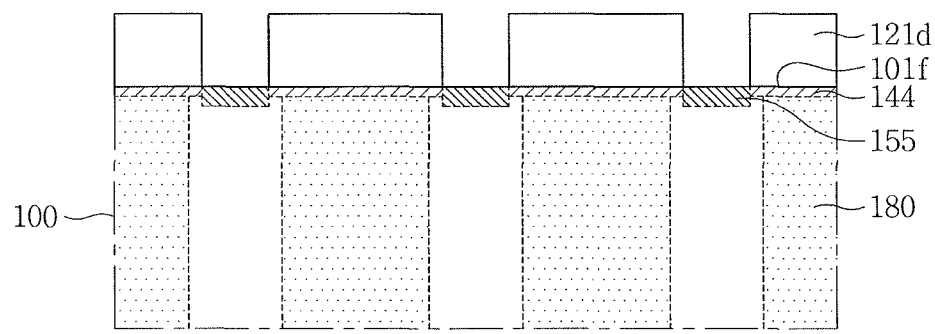

Referring to FIG. 7B, the method may include forming fifth P-type implantation regions 155 in the semiconductor substrate 100. The formation of the fifth P-type implantation regions 155 may include using a photolithography technique. The performance of the photolithography technique may include forming a plurality of fourth photoresist patterns 121d on the semiconductor substrate 100.

Figure 7C:
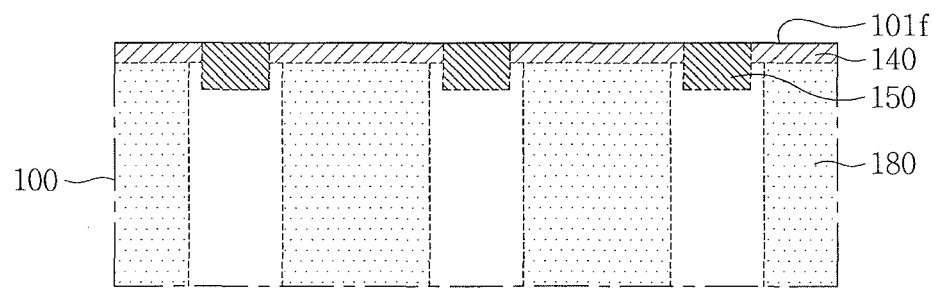

Referring to FIG. 7C, the method may include forming fourth P-type regions 140 and fifth P-type regions 150 in the semiconductor substrate 100. The formation of the fourth P-type regions 140 and the fifth P-type regions 150 may include using a laser annealing technique.

Figure 7D:
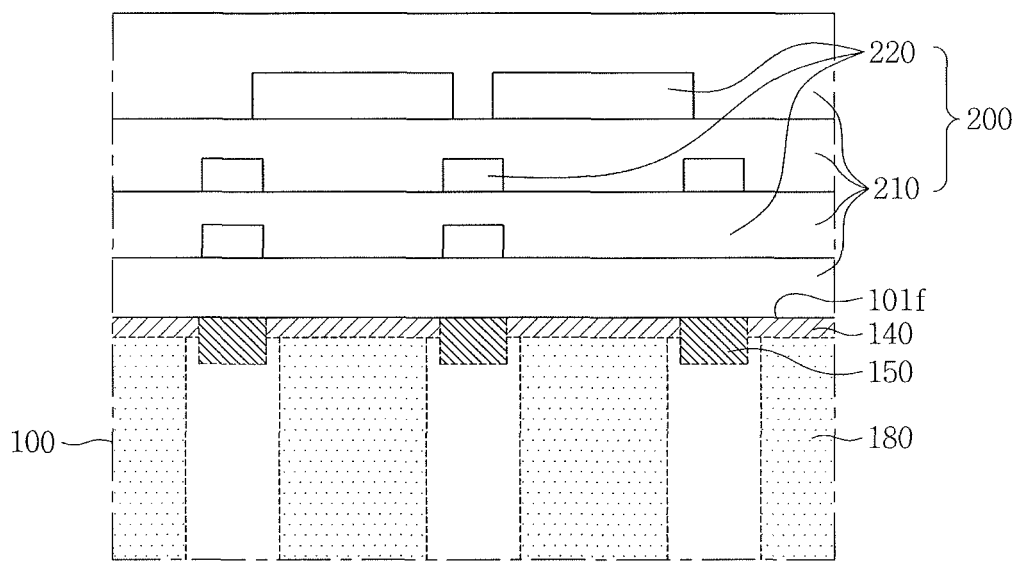

Referring to FIG. 7D, the method may include forming an interconnection portion 200 on the semiconductor substrate 100. The formation of the interconnection portion 200 may include forming interlayer insulting layers 210 and conductive patterns 220.

Figure 7E:
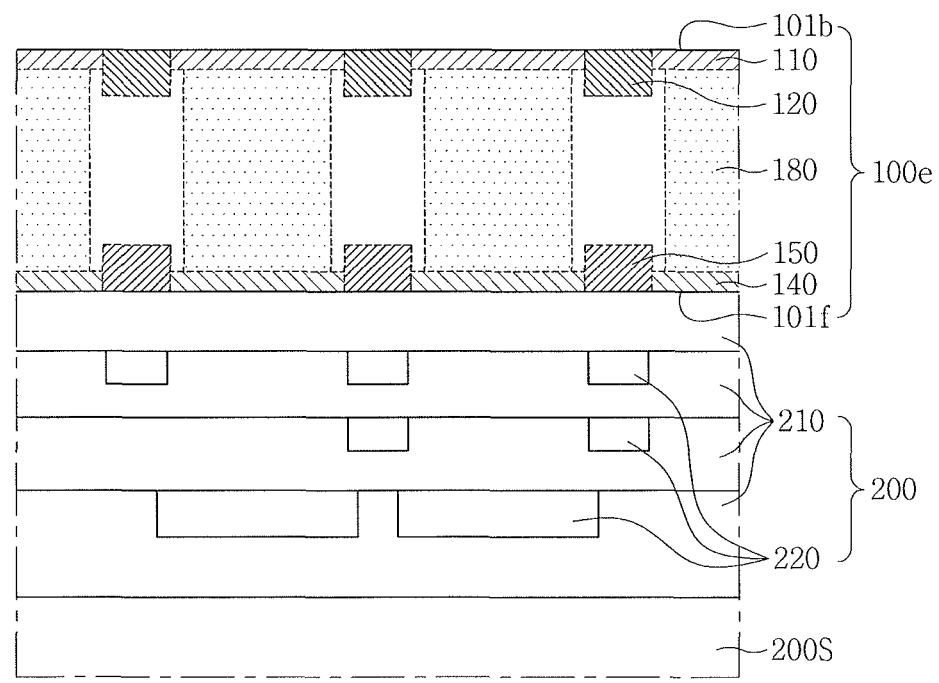

Referring to FIG. 7E, the method may include turning over the semiconductor substrate 100 and the interconnection portion 200 such that interconnection portion 200 and the semiconductor substrate 100 are sequentially stacked on a supporting substrate 200S, partially removing a back side 101b of the semiconductor substrate 100, and forming first P-type regions 110 and second P-type regions 120 under the back side 101b of the semiconductor substrate 100 to form a semiconductor substrate 100e.

The first P-type regions 110 and the second P-type regions 120 under the back side 101b may be formed to symmetrically face the fourth P-type regions 140 and the fifth P-type regions 150 under the front side 101f in the semiconductor substrate 100e. Then, the semiconductor device 10E of FIG. 1E may be completed by referring to FIGS. 2I to 2K.

Figure 8A:
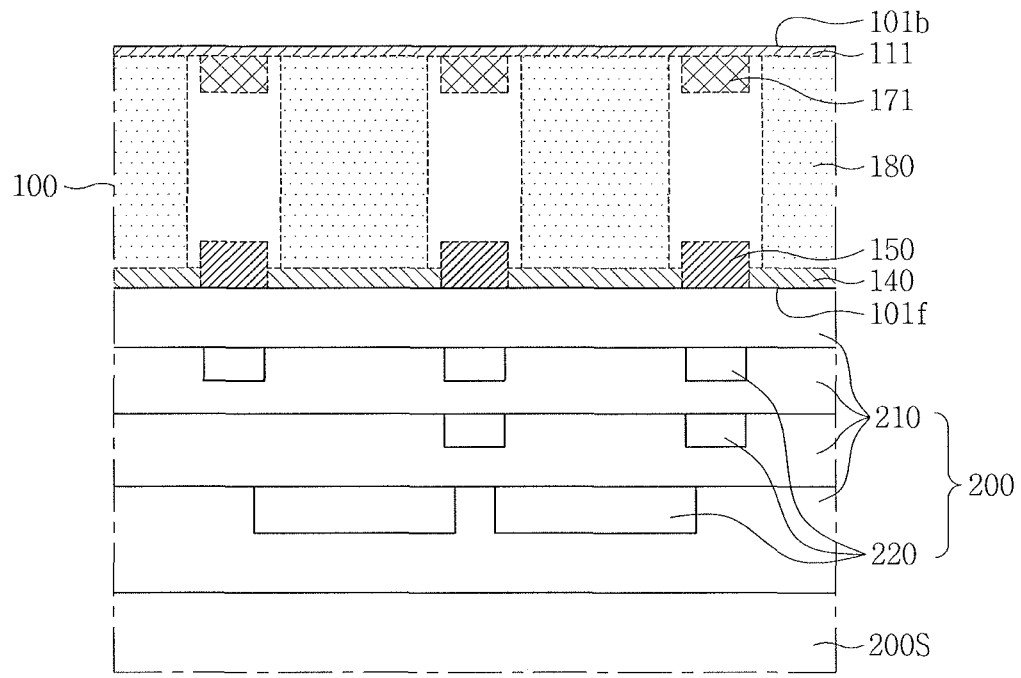
Figure 8B:
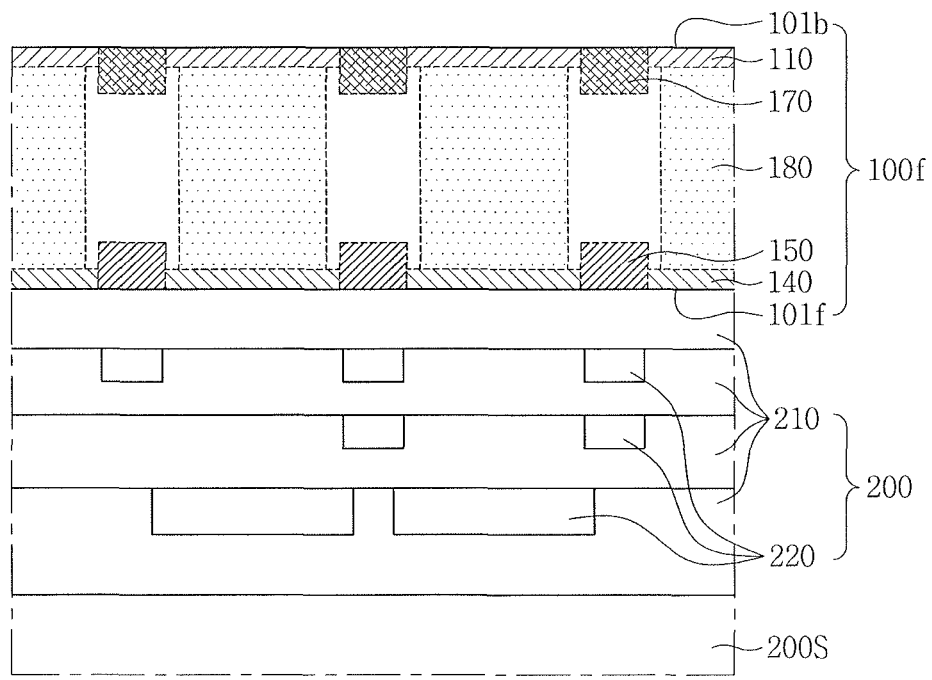

FIGS. 8A and 8B illustrate longitudinal sections depicting stages of a method of fabricating a semiconductor device according to another exemplary embodiment.

Referring to FIG. 8A, a method of fabricating a semiconductor device according to this embodiment may include, after the stages illustrated in FIGS. 2A, 2B, and 7A to 7D, forming a first P-type region 111 and amorphous impurity implantation regions 171 under the back side 101b in the semiconductor substrate 100.

Referring to FIG. 8B, the method may include forming a semiconductor substrate 100f, which has first P-type regions 110 and amorphous impurity regions 170 formed therein.

The first P-type regions 110 and the amorphous impurity regions 170 under the back side 101b may be formed symmetrically facing fourth P-type regions 140 and fifth P-type regions 150 under the front side 101f in the semiconductor substrate 100f. Then, the semiconductor device 10F of FIG. 1F may be completed by referring to the FIGS. 2I to 2K.

FIGS. 9A to 9E illustrate longitudinal sections illustrating a method of fabricating a semiconductor device according to another exemplary embodiment.

Figure 9A:
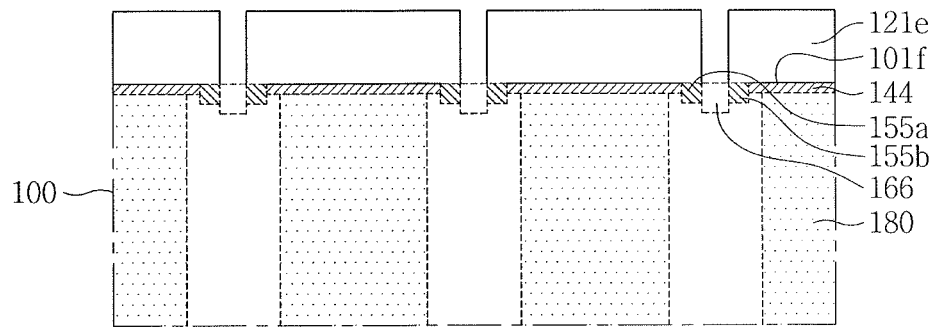

Referring to FIG. 9A, a method of fabricating a semiconductor device according to this exemplary embodiments may include, after the stages of FIGS. 2A, 2B, and 7A to 7B, forming sixth P-type implantation regions 166 in the semiconductor substrate 100. Each of the sixth P-type implantation regions 166 may divide the fifth P-type region 155 into a third portion 155a and a fourth portion 155b.

The formation of the sixth P-type regions 166 may include using a photolithography technique. The formation of the photolithography technique may include forming a plurality of fifth photoresist patterns 121e on the semiconductor substrate 100.

Figure 9B:
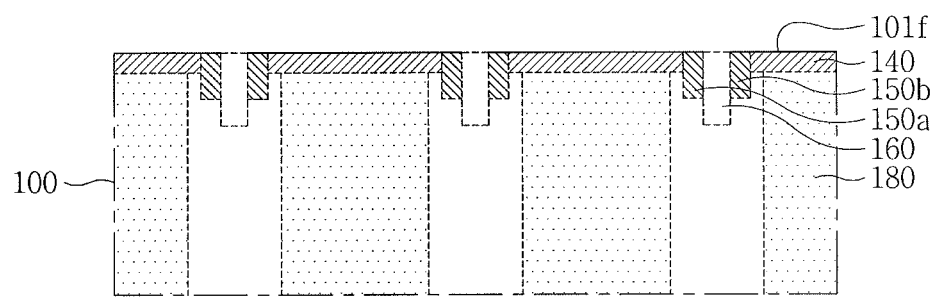

Referring to FIG. 9B, the method may include forming fourth P-type regions 140, fifth P-type separation regions 150a and 150b, and sixth P-type regions 160 in the semiconductor substrate 100.

Figure 9C:
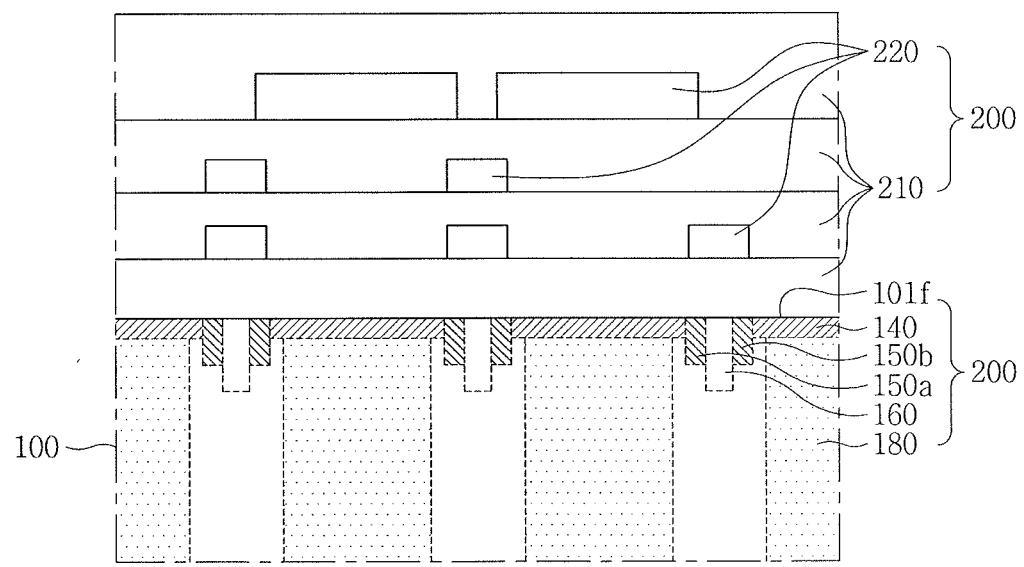

Referring to FIG. 9C, the method may include forming an interconnection portion 200 on the semiconductor substrate 100. The formation of the interconnection portion 200 may include forming interlayer insulting layers 210 and conductive patterns 220.

Figure 9D:
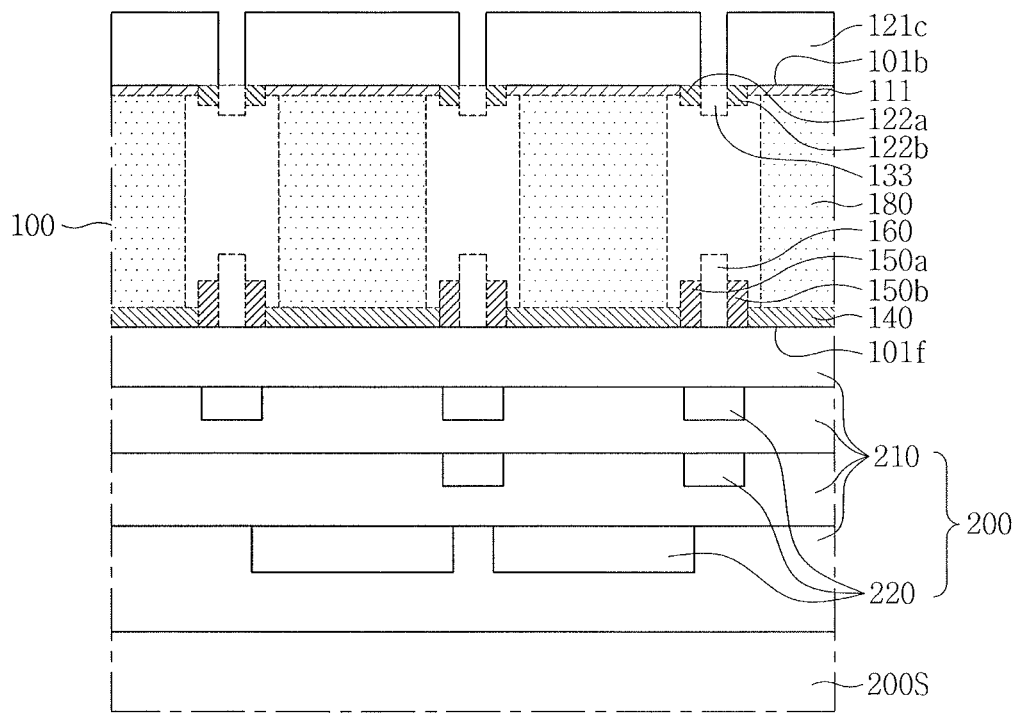

Referring to FIG. 9D, the method may include forming turning over the semiconductor substrate 100 and the interconnection portion 200 such that the interconnection portion 200 and the semiconductor substrate 100 are sequentially stacked on a supporting substrate 200S, partially removing a back side 101b of the semiconductor substrate 100, and forming a first P-type implantation region 111, first portions 122a, second portions 122b and third P-type implantation regions 133 under the back side 101b in the semiconductor substrate 100.

Figure 9E:
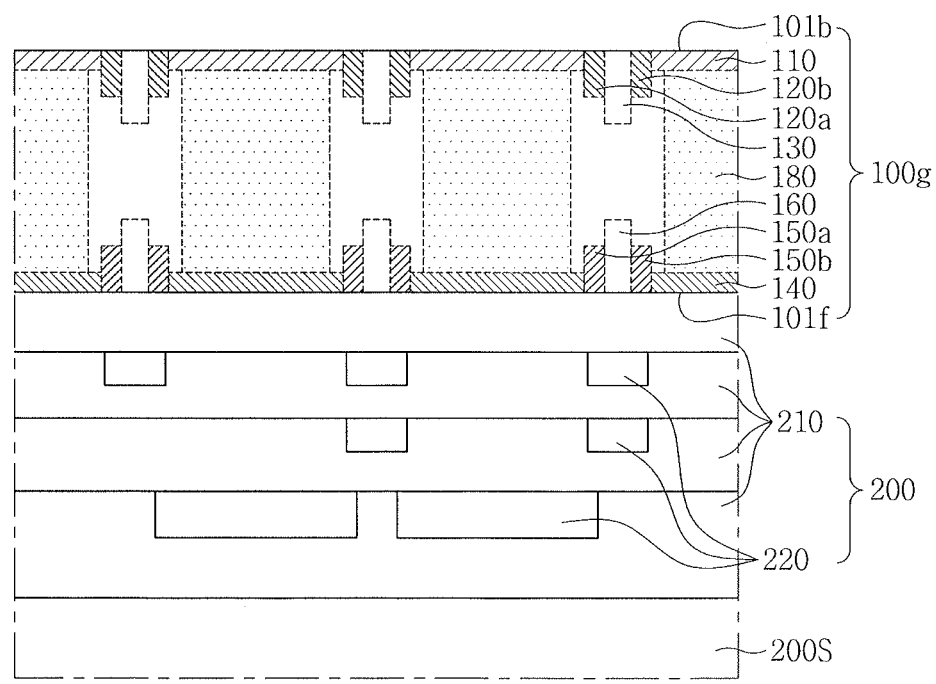

Referring to FIG. 9E, the method may include forming a semiconductor substrate 100g that has first P-type regions 110, second P-type separation regions 120a and 120b, and third P-type regions 130 formed therein. Then, the semiconductor device 10G of FIG. 1G may be completed by referring to FIGS. 2I to 2K.

Figure 10A:
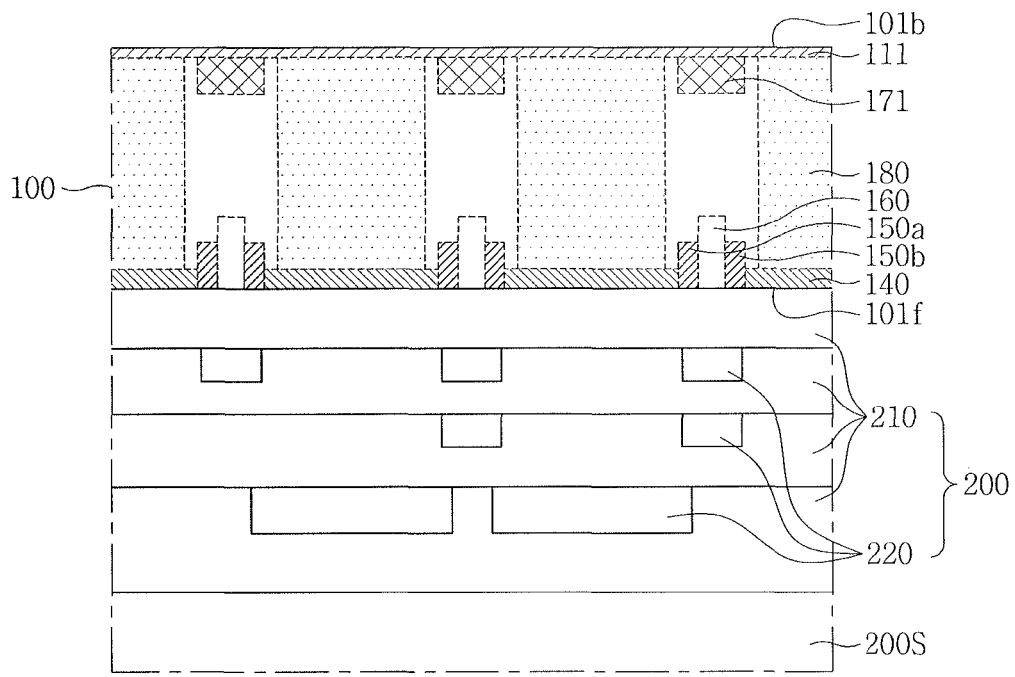
Figure 10B:
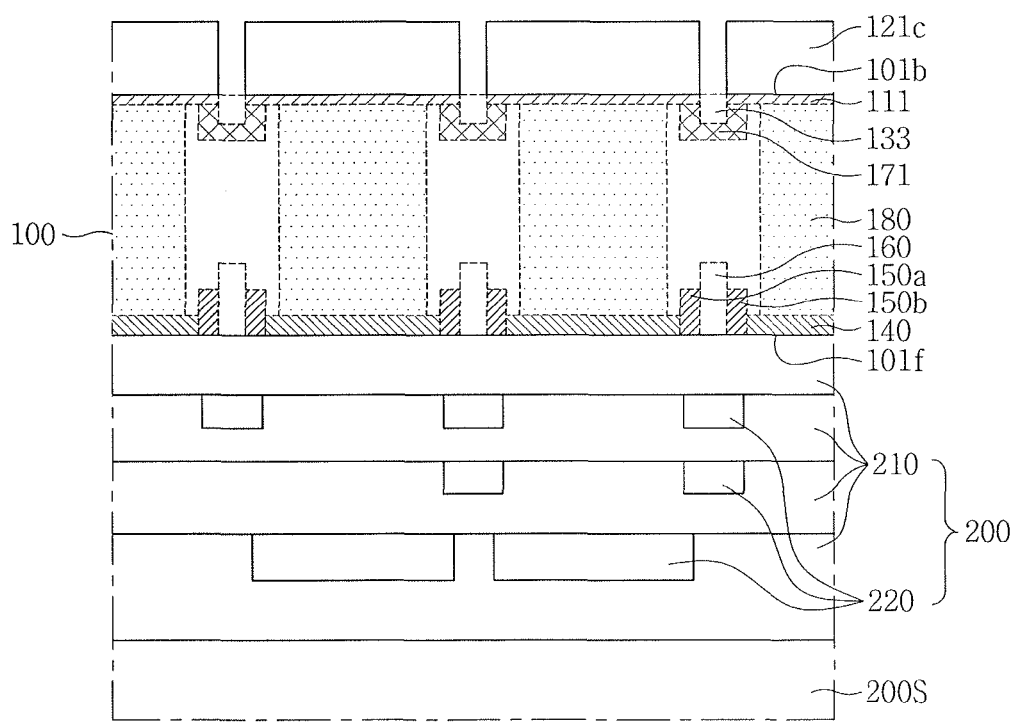
Figure 10C:
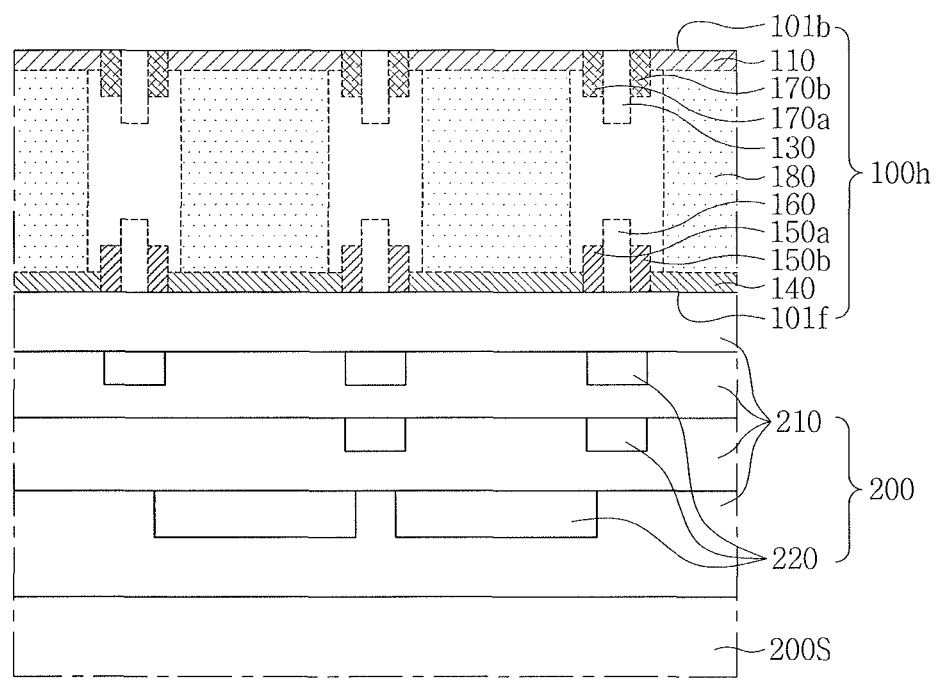

FIGS. 10A to 10C illustrate longitudinal sections illustrating a method of fabricating a semiconductor device according to another exemplary embodiment.

Referring to FIG. 10A, a method of fabricating a semiconductor device according to this exemplary embodiments may include, after the stages of FIGS. 2A, 2B, 7A, 7B, and 9A to 9C, forming a first P-type implantation region 111 and amorphous impurity implantation regions 171 in a back side 101b of the semiconductor substrate 100.

Referring to FIG. 10B, the method may include third P-type implantation regions 133 in the semiconductor substrate 100.

Referring to FIG. 10C, the method may include forming a semiconductor substrate 100h that has first P-type regions 110, amorphous impurity separation regions 170a and 170b, and third P-type regions 133 formed therein. Then, the semiconductor device 10H of FIG. 1H may be completed by referring to FIGS. 2I to 2K.

Figure 11:
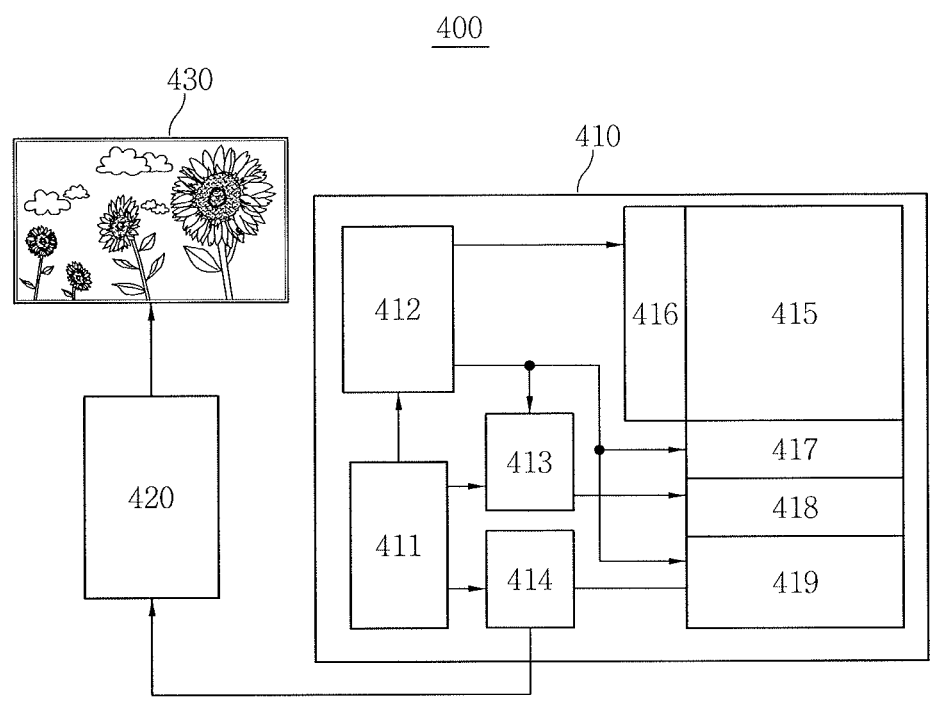
FIG. 11 illustrates a block diagram schematically showing a camera system including a semiconductor device according to exemplary embodiments.

FIG. 11 illustrates a block diagram schematically showing a camera system including a semiconductor device according to an exemplary embodiment.

Referring to FIG. 11, a camera system 400 according to an exemplary embodiment may include an image sensing part 410, an image signal processing part 420, and an image display part 430. The image sensing part 410 may include a control register block 411, a timing generator 412, a lamp generator 413, a buffer part 414, an active pixel sensor array 415, a row driver 416, a correlated double sampler 417, a comparator 418, and an analogue-to-digital converter 419.

The control register block 411 may control an overall operation of the camera system 400. For example, the control register block 411 may directly transmit an operation signal to the timing generator 412, the lamp generator 413 and the buffer part 414. The timing generator 412 may generate an operation timing reference signal for various elements of the image sensing part 410.

The timing generator 412 may transmit the operation timing reference signal to the row driver 416, the correlated double sampler 417, the comparator 418 and/or an analogue-to-digital converter 419, etc. The lamp generator 413 may generate and transmit a lamp signal used in the correlated double sampler 417 and/or the comparator 418, etc. The buffer part 414 may include a latch part. The buffer part 414 may temporarily store an image signal that may be sent to an exterior.

The active pixel sensor array 415 may sense an exterior image. The active pixel sensor array 415 may include a plurality of active pixel sensors, and each of which may include one of the semiconductor devices 10A to 10H of FIGS. 1A to 1H having a backside illumination CMOS image sensor according to one of the exemplary embodiments.

The row driver 416 may selectively activate a row of the active pixel sensor array 415. The correlated double sampler 417 may sample and output an analog signal generated the active pixel sensor array 415. The comparator 418 may compare data transmitted from the correlated double sampler 417 with slopes, etc of feed-backed lamp signals according to analog reference voltages, and generate various reference signals.

The analog-to-digital converter 419 may transform analog image data into digital image data.

Figure 12:
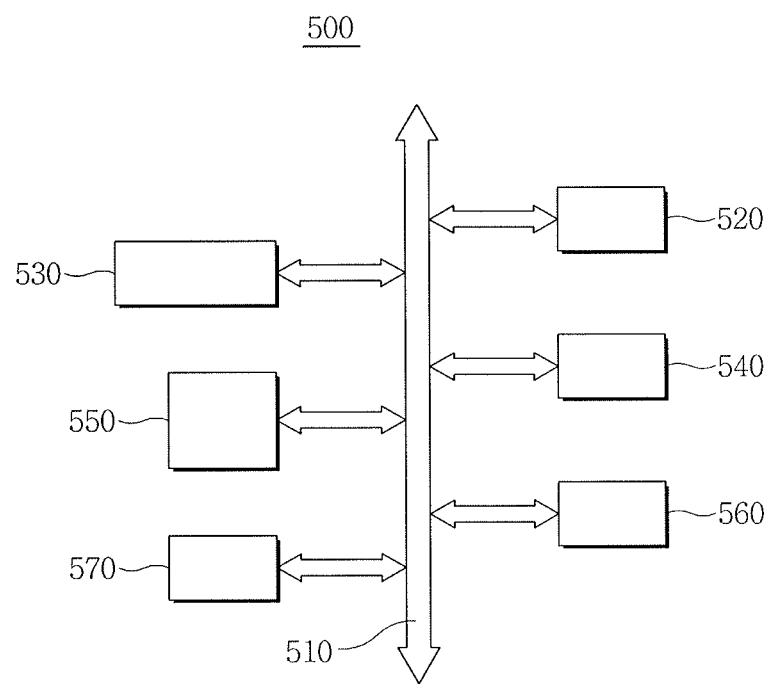
FIG. 12 illustrates a block diagram schematically showing an electronic system including a semiconductor device according to exemplary embodiments.

FIG. 12 illustrates a block diagram schematically showing an electronic system including a semiconductor device according to exemplary embodiments.

Referring to FIG. 12, an electronic system 500 according to exemplary embodiments may include a bus 510 and an image sensing part 520, a central processing unit 530, and an input/output unit 540, which are capable of inputting and outputting through the bus 510 to communicate with an exterior. The electronic system 500 may further include a memory drive 550. The electronic system 500 may further include an optical disk drive (ODD) 560. The electronic system 500 may further include an exterior communicating part 570.

The image sensing part 520 may include one of the semiconductor devices 10A to 10H of FIGS. 1A to 1H having a backside illumination CMOS image sensor according to exemplary embodiments. The central processing unit 530 may include a microprocessor. The input/output unit 540 may include one of various input units including an operation button, a switch, a keyboard, a mouse, a keypad, a touch pad, a scanner, a camera, an optical sensor, etc., or may include one of an LCD, LED and/or CRT monitor, a printer, and/or a visual information displaying device.

The memory drive 550 may include a dynamic random access memory (DRAM), a static random access memory (SRAM), a phase change random access memory (PRAM), a resistive random access memory (RRAM), a magnetic random access memory (MRAM), a non-volatile memory (NVM), a FLASH memory, a solid state disk (SSD), a hard disk (HD) and/or various memory devices or a drive thereof.

The optical disk drive (ODD) 560 may include, for example, a CD-ROM drive, a DVD drive, etc. The exterior communicating part 570 may include a modem, a LAN card, or a universal serial bus (USB), etc., and may further include an external memory, a Wibro communication device, an infrared communication device, etc.

By way of summation and review, a semiconductor device having a backside illumination CMOS image sensor and a method of fabricating the same according to exemplary embodiments may provide an image sensor suitable for reducing crosstalk between pixels.

A semiconductor device having a backside illumination CMOS image sensor and a method of fabricating the same according to exemplary embodiments may provide an image sensor with an improved quantum efficiency.

A semiconductor device having a backside illumination CMOS image sensor and a method of fabricating the same according to exemplary embodiments may provide an image sensor suitable for reducing dark current.

A semiconductor device having a backside illumination CMOS image sensor and a method of fabricating the same according to exemplary embodiments may provide an image sensor suitable for reducing white pixel defects.

The backside illumination CMOS image sensor according to exemplary embodiments may include a P-type region of a high concentration thicker than a P-type region of a low concentration.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. A semiconductor device, comprising:
   a substrate including a front side and a back side opposite the front side;
   first P-type regions located adjacent to the back side and spaced apart from each other in the substrate, the first P-type regions being in contact with the back side;
   N-type regions located under the first P-type regions and spaced apart from each other in the substrate, the N-type regions being in contact with the first P-type regions; and
   second P-type regions located adjacent to the back side and located between the first P-type regions, the second P-type regions being in contact with the back side;
   frontal P-type regions in contact with a lower surface of the N-type regions and the front side of the substrate; and
   insulating patterns located adjacent to the front side and located between the N-type regions, the insulating patterns being in contact with the front side of the substrate and the frontal P-type regions, wherein:
the second P-type regions are spaced apart from the insulating patterns, the second P-type regions are horizontally spaced apart from the N-type regions, and left-side surfaces of the second P-type regions are in contact with right-side surfaces of the first P-type regions, and right-side surfaces of the second P-type regions are in contact with left-side surfaces of the first P-type regions.

2. The semiconductor device as claimed in claim 1, wherein the second P-type regions have a greater vertical thickness than the first P-type regions, and have a lesser vertical thickness than the N-type regions.

3. The semiconductor device as claimed in claim 1, wherein the second P-type regions are narrower in maximum horizontal width than the first P-type regions, and are narrower in maximum horizontal width than the N-type regions.

4. The semiconductor device as claimed in claim 1, wherein the first P-type regions and the second P-type regions include boron.

5. The semiconductor device as claimed in claim 1, wherein the second P-type regions have a higher impurity concentration than the first P-type regions.

6. The semiconductor device as claimed in claim 1, wherein the second P-type regions include impurities selected from silicon (Si), carbon (C), germanium (Ge), tin (Sn), neon (Ne), argon (Ar), krypton (Kr), and xenon (Xe).

7. The semiconductor device as claimed in claim 1, further comprising third P-type regions located adjacent to the back side and located between the N-type regions.

8. The semiconductor device as claimed in claim 7, wherein the third P-type regions have a greater vertical thickness than the second P-type regions, and have a lesser vertical thickness than the N-type regions.

9. The semiconductor device as claimed in claim 7, wherein the third P-type regions are narrower in maximum horizontal width than the second P-type regions.

10. The semiconductor device as claimed in claim 7, wherein the third P-type regions include boron.

11. The semiconductor device as claimed in claim 7, wherein the third P-type regions have a higher impurity concentration than the second P-type regions.

12. A semiconductor device, comprising:
a substrate including a front side and a back side opposite the front side;
first P-type regions located adjacent to the back side and spaced apart from each other in the substrate;
first separation regions located adjacent to the back side between the first P-type regions, the first separation regions include second P-type regions having a greater impurity concentration than the first P-type regions;
N-type regions located under the first P-type regions and spaced apart from each other in the substrate;
frontal P-type regions located adjacent to the front side and in contact with a lower surface of the N-type regions; and
frontal separation regions located adjacent to the front side between the frontal P-type regions,
wherein:
the first separation regions have a greater vertical thickness than the first P-type regions,
the first separation regions have a lesser vertical thickness than the N-type regions,
the first separation regions are spaced apart from the N-type regions,
the frontal separation regions have a greater vertical thickness than the frontal P-type regions,
the frontal separation regions have a lesser vertical thickness than the N-type regions, and
the frontal separation regions are spaced apart from the N-type regions.

13. The semiconductor device as claimed in claim 12, wherein each of the first separation regions includes a pair of second P-type regions and a third P-type region between the second P-type regions, the third P-type region having a greater vertical thickness and a higher impurity concentration than the pair of second P-type regions.

14. The semiconductor device as claimed in claim 12, wherein the first separation regions include amorphous impurity separation regions.

15. The semiconductor device as claimed in claim 12, wherein the frontal separation regions include one selected from insulating patterns, amorphous impurity separation regions, fourth P-type separation regions, and separation regions including a pair of the fourth P-type separation regions and a fifth P-type separation region.

16. A semiconductor device, comprising:
a substrate including a front side and a back side;
insulating patterns in contact with the front side of the substrate and formed in the substrate;
frontal P-type regions in contact with the front side of the substrate and formed in the substrate;
first P-type regions in contact with the back side of the substrate and formed in the substrate;
N-type regions between the frontal P-type regions and the first P-type regions, and in contact with both the frontal P-type regions and the first P-type regions; and
second P-type regions between the first P-type regions and formed in the substrate;
wherein:
the second P-type regions are in contact with the first P-type regions,
the second P-type regions are vertically aligned with the insulating patterns,
the second P-type regions are vertically spaced apart from the insulating patterns,
the second P-type regions have a greater impurity concentration than the first P-type regions.

17. The semiconductor device as claimed in claim 16, wherein:
the second P-type regions have a greater vertical thickness than the first P-type regions, and
the second P-type regions have a lesser vertical thickness than the N-type regions.

18. The semiconductor device as claimed in claim 16, wherein:
the insulating patterns have a greater vertical thickness than the frontal P-type regions,
the insulating patterns have a lesser vertical thickness than the N-type regions, and
the insulating patterns are spaced apart from the N-type regions.

19. The semiconductor device as claim in claim 16, wherein:
the second P-type regions are spaced apart from the N-type regions, and
the insulating patterns are in contact with the frontal P-type regions.

* * * * *